US012796137B2

(12) United States Patent
Huh et al.

(10) Patent No.: US 12,796,137 B2
(45) Date of Patent: Nov. 10, 2026

(54) IMAGE SENSOR AND ELECTRONIC SYSTEM INCLUDING THE SAME

(71) Applicant: SAMSUNG ELECTRONICS CO., LTD., Suwon-si (KR)

(72) Inventors: Jinsuk Huh, Suwon-si (KR); Seonok Kim, Suwon-si (KR); Youngbin Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 382 days.

(21) Appl. No.: 18/385,533

(22) Filed: Oct. 31, 2023

(65) Prior Publication Data

US 2024/0153976 A1 May 9, 2024

(30) Foreign Application Priority Data

Nov. 9, 2022 (KR) ........................ 10-2022-0148971

(51) Int. Cl.
*H10F 39/00* (2025.01)
*H10F 39/18* (2025.01)

(52) U.S. Cl.
CPC ....... *H10F 39/8057* (2025.01); *H10F 39/182* (2025.01); *H10F 39/8063* (2025.01)

(58) Field of Classification Search
CPC ............... H10F 39/8057; H10F 39/182; H10F 39/8063; H10F 39/199; H10F 39/8053; H10F 39/807; H10F 39/802; H10F 39/811; H04N 25/76
USPC .......................................................... 257/432
See application file for complete search history.

(56) References Cited

U.S. PATENT DOCUMENTS

| | | | |
|---|---|---|---|
| 8,193,479 B2 | 6/2012 | Roy et al. | |
| 9,609,250 B2 | 3/2017 | Lee et al. | |
| 9,893,111 B2 | 2/2018 | Chou et al. | |
| 11,398,515 B2 | 7/2022 | Honda et al. | |
| 2008/0060034 A1* | 3/2008 | Egnal | G01C 11/02 348/340 |

(Continued)

FOREIGN PATENT DOCUMENTS

| | | |
|---|---|---|
| KR | 10-2022-0019895 A | 2/2022 |
| KR | 10-2022-0055390 A | 5/2022 |
| KR | 10-2022-0086732 A | 6/2022 |

OTHER PUBLICATIONS

Shim et al., 2021 Symposium on VLSI Circuits, Jun. 13-19, 2021.
Office Action in Korean Appln. No. 10-2022-0148971, mailed on Jun. 9, 2026, 15 pages (with English translation).

*Primary Examiner* — Sheikh Maruf
(74) *Attorney, Agent, or Firm* — Fish & Richardson P.C.

(57) ABSTRACT

An image sensor including a color pixel including a plurality of subpixels arranged in an m×n matrix, and each of m and n is a natural number of 2 to 10, on a substrate, and a pixel isolation structure configured to isolate each of the plurality of subpixels in the color pixel, wherein the pixel isolation structure includes, an outer isolation layer surrounding the color pixel, at least one isolation layer connection portion extending in a center direction of the color pixel from an inner wall of the outer isolation layer, at least one inner isolation layer limiting a size of a partial region of each of the plurality of subpixels in a region limited by the outer isolation layer, including a part between two subpixels adjacent to each other among the plurality of subpixels.

20 Claims, 20 Drawing Sheets

300

(56) References Cited

U.S. PATENT DOCUMENTS

| | | | | |
|---|---|---|---|---|
| 2010/0282945 | A1* | 11/2010 | Yokogawa | H04N 25/00 250/225 |
| 2014/0218572 | A1* | 8/2014 | Ootsuka | H10F 39/024 438/70 |
| 2020/0411578 | A1* | 12/2020 | Tanaka | H10F 39/024 |
| 2021/0028208 | A1 | 1/2021 | Huang | |
| 2021/0134863 | A1 | 5/2021 | Suzuki | |
| 2021/0144315 | A1* | 5/2021 | Yun | H04N 25/42 |
| 2021/0358993 | A1* | 11/2021 | Mao | H04N 25/133 |
| 2021/0391363 | A1* | 12/2021 | Ai | G03B 13/36 |
| 2022/0037387 | A1* | 2/2022 | Tsao | H10F 39/011 |
| 2022/0038651 | A1* | 2/2022 | Kang | H04N 25/616 |
| 2022/0045110 | A1* | 2/2022 | Fujita | H04N 25/704 |
| 2022/0165774 | A1 | 5/2022 | Kim et al. | |
| 2022/0190007 | A1* | 6/2022 | Kim | H10F 39/011 |
| 2022/0216260 | A1* | 7/2022 | Chou | H04N 25/77 |
| 2022/0415949 | A1* | 12/2022 | Tanaka | H04N 23/12 |

* cited by examiner

II - II'

II - II'

IMAGE SENSOR AND ELECTRONIC SYSTEM INCLUDING THE SAME

CROSS-REFERENCE TO RELATED APPLICATION

Korean Patent Application No. 10-2022-0148971, filed on Nov. 9, 2022, in the Korean Intellectual Property Office, is incorporated by reference herein in its entirety.

BACKGROUND

1. Field

An image sensor and an electronic system including the same is disclosed.

2. Description of the Related Art

An image sensor for capturing an image and converting the captured image into an electrical signal is used in various fields, such as the digital camera field, the camcorder field, the personal communication system (PCS) field, the game machine field, the surveillance camera field, and the medical micro camera field, along with the development of the computer industry and the communications industry.

SUMMARY

Embodiments are directed to an image sensor including a color pixel including a plurality of subpixels arranged in an m×n matrix, and each of m and n is a natural number of 2 to 10, on a substrate, and a pixel isolation structure configured to isolate each of the plurality of subpixels in the color pixel, wherein the pixel isolation structure includes an outer isolation layer surrounding the color pixel, at least one isolation layer connection portion extending in a center direction of the color pixel from an inner wall of the outer isolation layer, at least one inner isolation layer limiting a size of a partial region of each of the plurality of subpixels in a region limited by the outer isolation layer, including a part between two subpixels adjacent to each other among the plurality of subpixels, and extending in a vertical downward direction from the at least one isolation layer connection portion, an isolation liner covering both sidewalls of the at least one inner isolation layer, and at least one isolation pillar in contact with at least two subpixels selected from among the plurality of subpixels and limiting the size of the partial region of each of the plurality of subpixels together with the at least one inner isolation layer.

Embodiments are directed to an image sensor including a pixel group on a substrate and including a plurality of color pixels each including a plurality of subpixels arranged in a 2×2 matrix, and a pixel isolation structure configured to isolate each of the plurality of subpixels in each of the plurality of color pixels, wherein each of the plurality of color pixels include a plurality of subpixels, the plurality of subpixels in one color pixel selected from among the plurality of color pixels are arranged in an m×n matrix, and each of m and n is a natural number of 2 to 10, the plurality of subpixels in the selected one color pixel has the same color, and the pixel isolation structure includes an outer isolation layer surrounding the color pixel, at least one isolation layer connection portion extending in a center direction of the color pixel from an inner wall of the outer isolation layer, a plurality of inner isolation layers limiting a size of a partial region of each of the plurality of subpixels in a region limited by the outer isolation layer, including a part between two subpixels adjacent to each other among the plurality of subpixels, and extending in a vertical downward direction from the at least one isolation layer connection portion, an isolation liner covering both sidewalls of the plurality of inner isolation layers, and a plurality of isolation pillars in contact with at least two subpixels selected from among the plurality of subpixels and limiting the size of the partial region of each of the plurality of subpixels together with the plurality of inner isolation layers, the plurality of inner isolation layers being separated from each other in a horizontal direction.

Embodiments are directed to an electronic system including at least one camera including an image sensor, and a processor configured to process image data received from the at least one camera, wherein the image sensor includes a color pixel including a plurality of subpixels arranged in an m×n matrix, and each of m and n is a natural number of 2 to 10, on a substrate, and a pixel isolation structure configured to isolate each of the plurality of subpixels in the color pixel, the pixel isolation structure including an outer isolation layer surrounding the color pixel, at least one isolation layer connection portion extending in a center direction of the color pixel from an inner wall of the outer isolation layer, at least one inner isolation layer limiting a size of a partial region of each of the plurality of subpixels in a region limited by the outer isolation layer, including a part between two subpixels adjacent to each other among the plurality of subpixels, and extending in a vertical downward direction from the at least one isolation layer connection portion, an isolation liner covering both sidewalls of the at least one inner isolation layers, and at least one isolation pillar in contact with at least two subpixels selected from among the plurality of subpixels and limiting the size of the partial region of each of the plurality of subpixels together with the at least one inner isolation layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
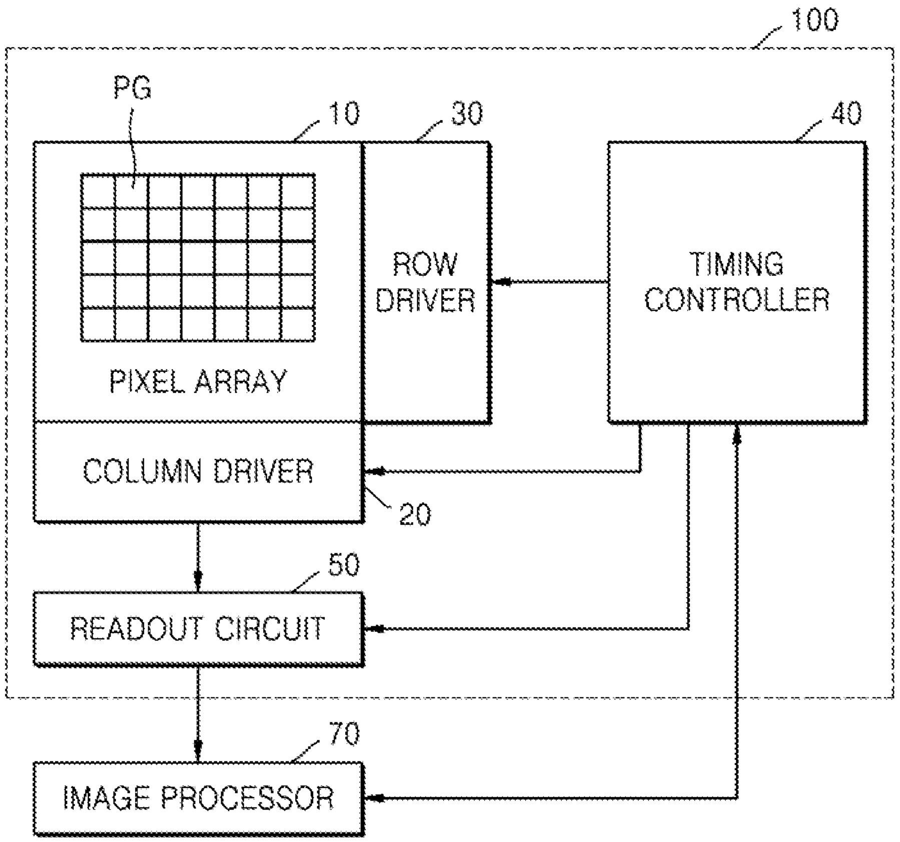
FIG. 1 is a block diagram of an image sensor according to example embodiments.

FIG. 1 is a block diagram of an image sensor 100 according to example embodiments. Referring to FIG. 1, the image sensor 100 may include a pixel array 10 and circuits configured to control the pixel array 10. In embodiments, the circuits configured to control the pixel array 10 may include a column driver 20, a row driver 30, a timing controller 40, and a readout circuit 50.

The image sensor 100 may operate in response to a control command received from an image processor 70, and convert light transferred from an external object into an electrical signal and output the electrical signal to the image processor 70. The image sensor 100 may be a complementary metal-oxide semiconductor (CMOS) image sensor.

The pixel array 10 may include a plurality of pixel groups PG having a two-dimensional array structure arranged in a matrix form along a plurality of row lines and a plurality of column lines. The term "row" used in the specification indicates a set of a plurality of pixels arranged in a horizontal direction among a plurality of pixels included in the pixel array 10, and the term "column" indicates a set of a plurality of pixels arranged in a vertical direction among the plurality of pixels included in the pixel array 10.

Each of the plurality of pixel groups PG may have a multi-pixel structure including a plurality of photodiodes. In each of the plurality of pixel groups PG, the plurality of photodiodes may generate charges by receiving light transferred from an object. The image sensor 100 may perform an autofocus function by using a phase difference of a pixel signal generated by the plurality of photodiodes included in each of the plurality of pixel groups PG. Each of the plurality of pixel groups PG may include a pixel circuit configured to generate a pixel signal from charges generated by the plurality of photodiodes.

The plurality of pixel groups PG may reproduce an object by a set of red pixels, green pixels, or blue pixels. In embodiments, a pixel group PG may include a plurality of color pixels in a Bayer pattern including red, green, and blue colors. Each of the plurality of color pixels included in the pixel group PG may include a plurality of subpixels arranged in an m×n matrix. Herein, each of m and n is a natural number greater than or equal to 2, e.g., 2 to 10. Each of the plurality of subpixels included in each of the plurality of pixel groups PG may receive light having passed through a color filter of the same color. As used herein, the term "or" is not an exclusive term, e.g., "A or B" would include A, B, or A and B.

The column driver 20 may include a correlated double sampler (CDS), an analog-to-digital converter (ADC), and the like. The CDS may be connected through column lines to a subpixel included in a row selected by a row select signal supplied from the row driver 30 and may detect a reset voltage and a pixel voltage by performing correlated double sampling. The ADC may convert the reset voltage and the pixel voltage detected by the CDS into a digital signal and transmit the digital signal to the readout circuit 50.

The readout circuit 50 may include a latch or buffer circuit capable of temporarily storing a digital signal, an amplification circuit, and the like, and temporarily store the digital signal received from the column driver 20 or generate image data by amplifying the temporarily stored digital signal. Operation timings of the column driver 20, the row driver 30, and the readout circuit 50 may be determined by the timing controller 40, and the timing controller 40 may operate in response to a control command transmitted from the image processor 70.

The image processor 70 may perform signal processing on the image data output from the readout circuit 50 and output the image-processed image data to a display device or store the image-processed image data in a storage device, such as a memory. When the image sensor 100 is mounted on an autonomous vehicle, the image processor 70 may perform signal processing on image data and transmit the image-processed image data to a main controller configured to control the autonomous vehicle, or the like.

Figure 2:
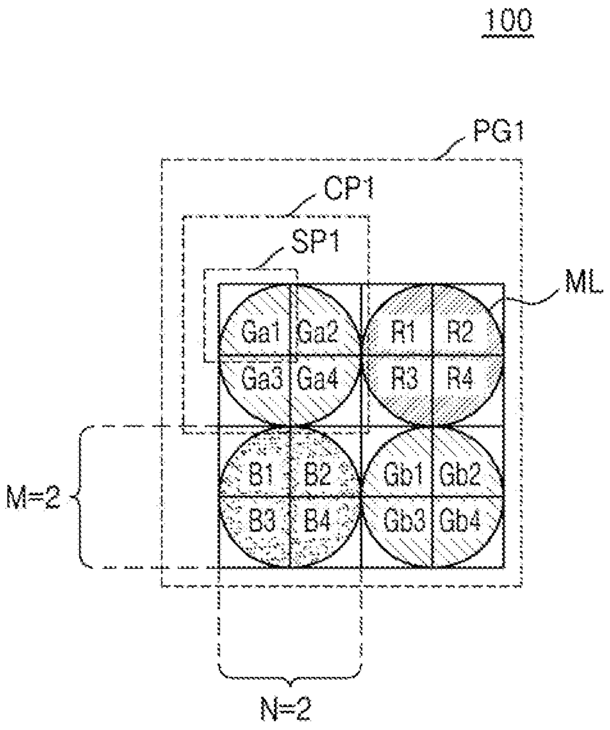
FIG. 2 is a top view of a pixel group, which may be included in an image sensor, according to example embodiments.

FIG. 2 is a top view of a pixel group PG1, which may be included in the image sensor 100, according to example embodiments. Referring to FIG. 2, the pixel group PG1 may constitute at least one of the plurality of pixel groups PG described with reference to FIG. 1. The pixel group PG1 may include four color pixels CP1 constituting a Bayer pattern including a red color, a green color, and a blue color. Each of the four color pixels CP1 may include four subpixels SP1 arranged in a 2×2 matrix. The pixel group PG1 may include a first green color pixel including four first green subpixels Ga1, Ga2, Ga3, and Ga4 arranged in a 2×2 matrix, a red color pixel including four red subpixels R1, R2, R3, and R4 arranged in a 2×2 matrix, a blue color pixel including four blue subpixels B1, B2, B3, and B4 arranged in a 2×2 matrix, and a second green color pixel including four second green subpixels Gb1, Gb2, Gb3, and Gb4 arranged in a 2×2 matrix. One color pixel CP1 may include one microlens ML covering four subpixels SP1. Four microlenses ML may be arranged to correspond to four color pixels CP1. The pixel group PG1 constructed in the arrangement shown in FIG. 2 may be referred to as a tetra cell.

The pixel group PG1 may include two green color pixels, one red color pixel, and one blue color pixel. One color pixel CP1 may include four subpixels SP1 having the same color information.

FIGS. 3A to 3D are top views and cross-sectional views of an image sensor 100 according to example embodiments. An example construction of a color pixel CP1 included in the image sensor 100 is described with reference to FIGS. 3A to 3D.

Referring to FIGS. 3A to 3D, the image sensor 100 may include the color pixel CP1 including four subpixels SP1 arranged in a 2×2 matrix on a substrate 102, and a pixel isolation structure 110 constructed to isolate each of the four subpixels SP1 in the color pixel CP1. The four subpixels SP1 may include a sensing area SA limited by an outer isolation layer 112. The sensing area SA may be an area in which light incident from the outside of the color pixel CP1 is sensed. In an implementation, four subpixels SP1 included in one color pixel CP1 may include pixels of the same color. FIGS. 3A to 3D show that the color pixel CP1 includes the four subpixels SP1 limited by the pixel isolation structure 110. The color pixel CP1 may include a plurality of subpixels arranged in an m×n matrix, where each of m and n is a natural number of greater than or equal to 2, e.g., 2 to 10.

The substrate 102 may include a semiconductor layer. In embodiments, the substrate 102 may include a semiconductor layer doped with a P-type impurity. In an implementation, the substrate 102 may include a semiconductor layer including silicon (Si), germanium (Ge), SiGe, a Group II-VI compound semiconductor, or a Group III-V compound semiconductor. In embodiments, the substrate 102 may include a P-type epitaxial semiconductor layer epitaxially grown from a P-type bulk Si substrate. The substrate 102 may include a front-side surface 102A and a backside surface 102B, which may be opposite to each other.

The color pixel CP1 may include four photodiodes respectively arranged in the four subpixels SP1. The four photodiodes may be first to fourth photodiodes PD1, PD2, PD3, and PD4. One subpixel SP1 may include one selected from among the first to fourth photodiodes PD1, PD2, PD3, and PD4. The color pixel CP1 may have a structure in which the first to fourth photodiodes PD1, PD2, PD3, and PD4 share one floating diffusion region FD. The first to fourth photodiodes PD1, PD2, PD3, and PD4 may be arranged around the floating diffusion region FD in the sensing area SA. The first to fourth photodiodes PD1, PD2, PD3, and PD4 may be arranged outward in a radial direction from the floating diffusion region FD to surround the floating diffusion region FD.

A transfer transistor TX of each of four subpixels SP1 included in one color pixel CP1 may share one floating diffusion region FD as a common drain region. FIGS. 3A to 3D show that four subpixels SP1 included in one color pixel CP1 share one floating diffusion region FD. Four subpixels SP1 included in one color pixel CP1 may include separate floating diffusion regions FD, respectively, or at least two of the four subpixels SP1 may share one floating diffusion region FD.

As shown in FIGS. 3A to 3D, the image sensor 100 may include the pixel isolation structure 110 configured to isolate each of the four subpixels SP1 in the color pixel CP1. The pixel isolation structure 110 may include the outer isolation layer 112, a plurality of isolation layer connection portions 113, a plurality of inner isolation layers 114, an isolation liner 116, and an isolation pillar 118.

In the pixel isolation structure 110, the outer isolation layer 112 may surround the color pixel CP1 to limit a size of the color pixel CP1. The plurality of isolation layer connection portions 113 and the plurality of inner isolation layers 114 may limit a size of a partial region of each of the four subpixels SP1 in an area limited by the outer isolation layer 112. Each of the plurality of isolation layer connection portions 113 and the plurality of inner isolation layers 114 may include a part between two subpixels SP1 adjacent to each other among the four subpixels SP1. The isolation liner 116 may cover a sidewall of the outer isolation layer 112 facing the sensing area SA, and both sidewalls of each of the plurality of isolation layer connection portions 113 and the plurality of inner isolation layers 114 facing the first to fourth photodiodes PD1, PD2, PD3, and PD4.

Each of the plurality of isolation layer connection portions 113 may extend inward from an inner wall of the outer isolation layer 112 in the color pixel CP1. In addition, an upper surface of each of the plurality of isolation layer connection portions 113 may come in contact with the front-side surface 102A of the substrate 102. In an implementation, the image sensor 100 may include four isolation layer connection portions 113. In addition, the plurality of inner isolation layers 114 may be separated from each other in a horizontal direction (an X direction and/or a Y direction) and extend in a vertical downward direction from the bottoms of the plurality of isolation layer connection portions 113. One side surface of at least one of the plurality of inner isolation layers 114 may entirely come in contact with an inner side surface of the outer isolation layer 112.

In the specification, a lower surface of a certain component may indicate a surface closer to a microlens ML among two surfaces separated in a vertical direction (a Z direction), and an upper surface of the certain component may indicate a surface opposite to the lower surface among the two surfaces.

The outer isolation layer 112 may be connected to each of the plurality of inner isolation layers 114 through the plurality of isolation layer connection portions 113. In an implementation, the outer isolation layer 112 may be electrically connected to each of the plurality of inner isolation layers 114 through the plurality of isolation layer connection portions 113. In an implementation, when a bias voltage Vbias is applied to the outer isolation layer 112, the bias voltage Vbias may be applied to each of the plurality of inner isolation layers 114. A second isolation pillar 118B may be between parts adjacent to lower surfaces of adjacent two of the plurality of inner isolation layers 114.

The bias voltage Vbias may be applied to a voltage application wiring layer 190 through an external wiring layer. The image sensor 100 may include a plurality of contacts 192 electrically connecting the voltage application wiring layer 190 to the pixel isolation structure 110.

The isolation pillar 118 may include one first isolation pillar 118A arranged adjacent to the center of the color pixel CP1, and a plurality of second isolation pillars 118B separated from the first isolation pillar 118A in the horizontal direction (the X direction and/or the Y direction).

The first isolation pillar 118A may be in contact with four subpixels SP1 included in one color pixel CP1 and limit a size of a partial region of each of the four subpixels SP1 together with the plurality of inner isolation layers 114. The second isolation pillar 118B may be in contact with two subpixels SP1 and inner isolation layers 114. The second isolation pillar 118B may be arranged so that at least parts of the two inner isolation layers 114 may be separated from each other in the horizontal direction (the X direction and/or the Y direction).

A range of a first height H1 that is a height of the substrate 102 may be about 0.5 micrometers to about 3 micrometers. In addition, a range of a second height H2 that is a height of the second isolation pillar 118B may be about 0.4 micrometers to about 2.4 micrometers. The first height H1 may be greater than the second height H2. In addition, the first height H1 may be within about 50% of a third height H3 that is a height of the isolation layer connection portion 113. The third height H3 may be about 0.1 micrometers to about 0.6 micrometers.

A range of a first width W1 that is a horizontal width of each of lower surfaces of the plurality of inner isolation layers 114 may be about 50 nm to about 400 nm. In addition, a range of a second width W2 that is a horizontal width of each of the plurality of second isolation pillars 118B may be about 50 nm to about 400 nm.

Figure 3A:
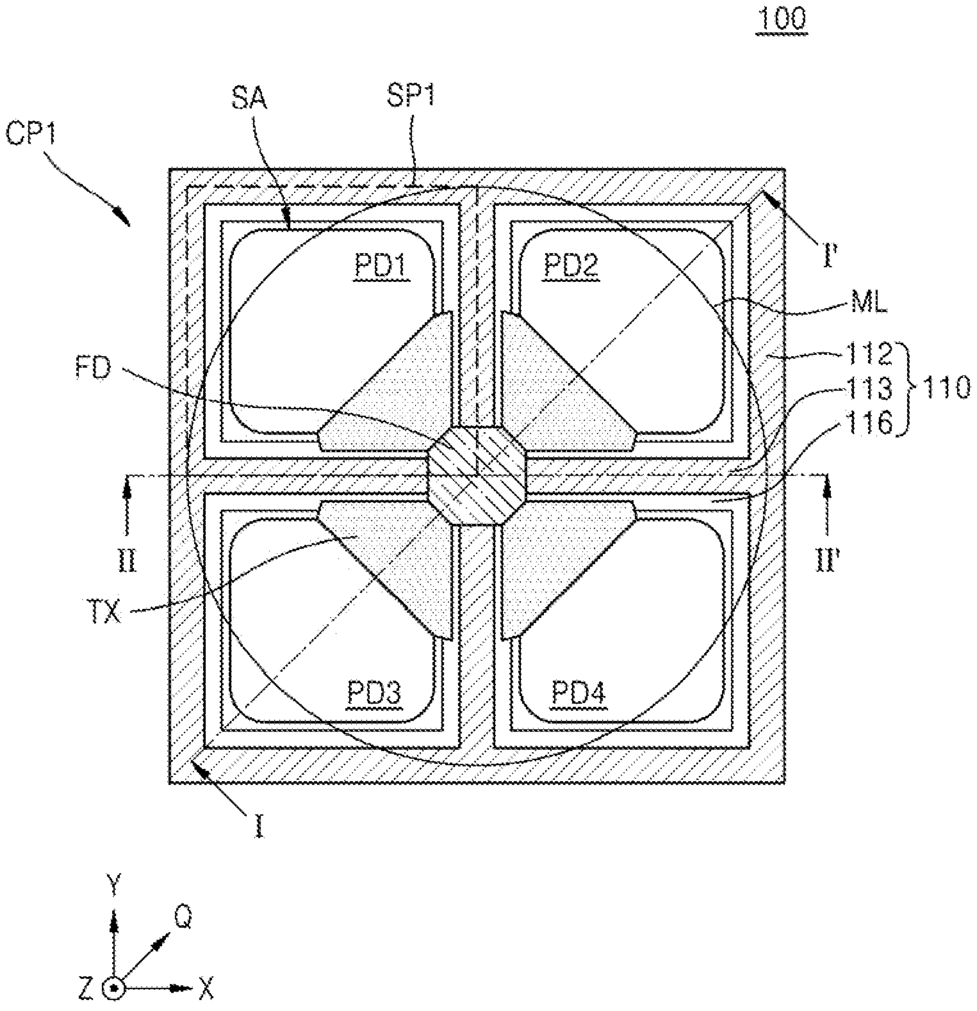
FIGS. 3A to 3D are top views and cross-sectional views of an image sensor according to example embodiments.
Figure 3B:
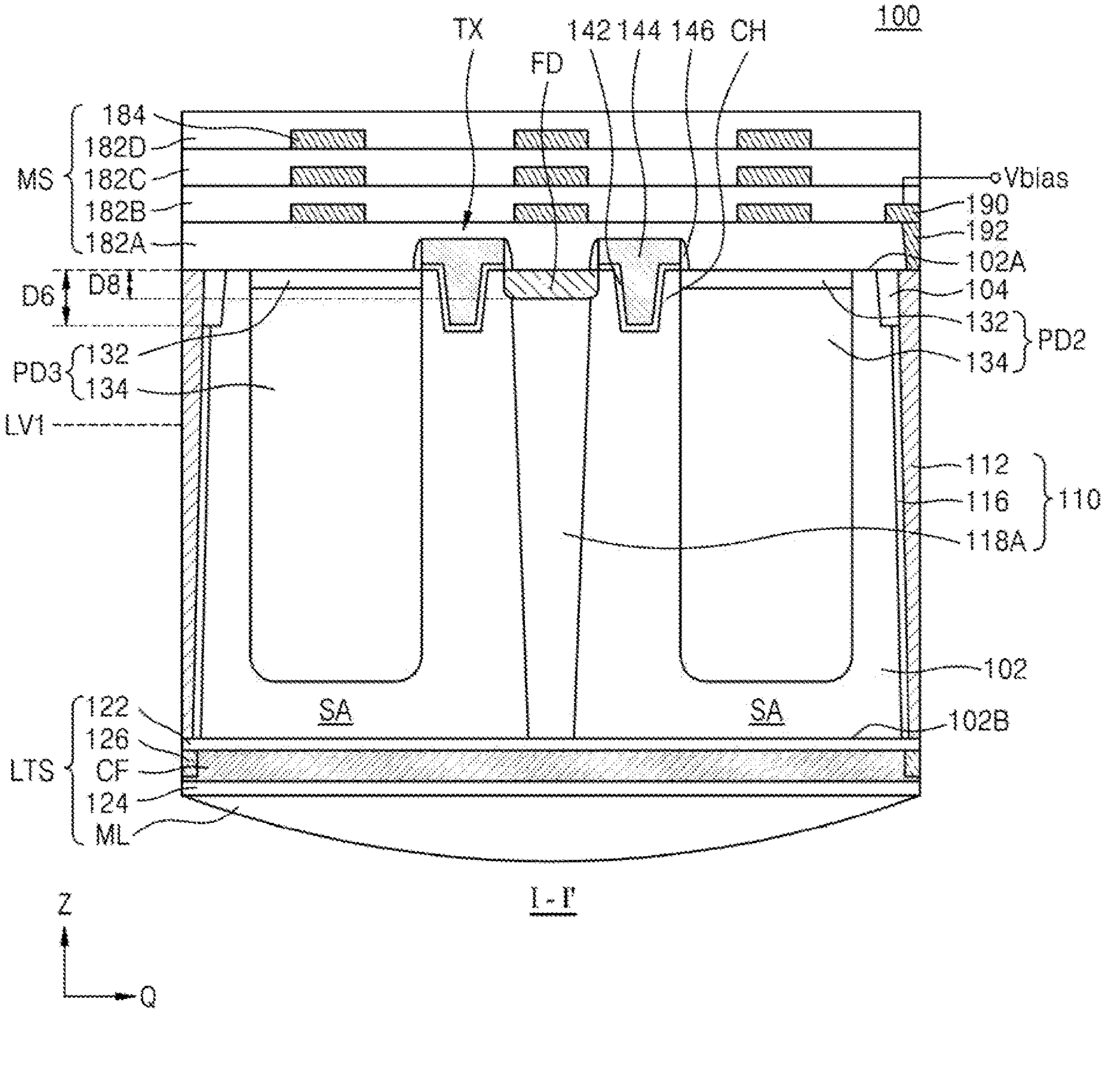
Figure 3C:
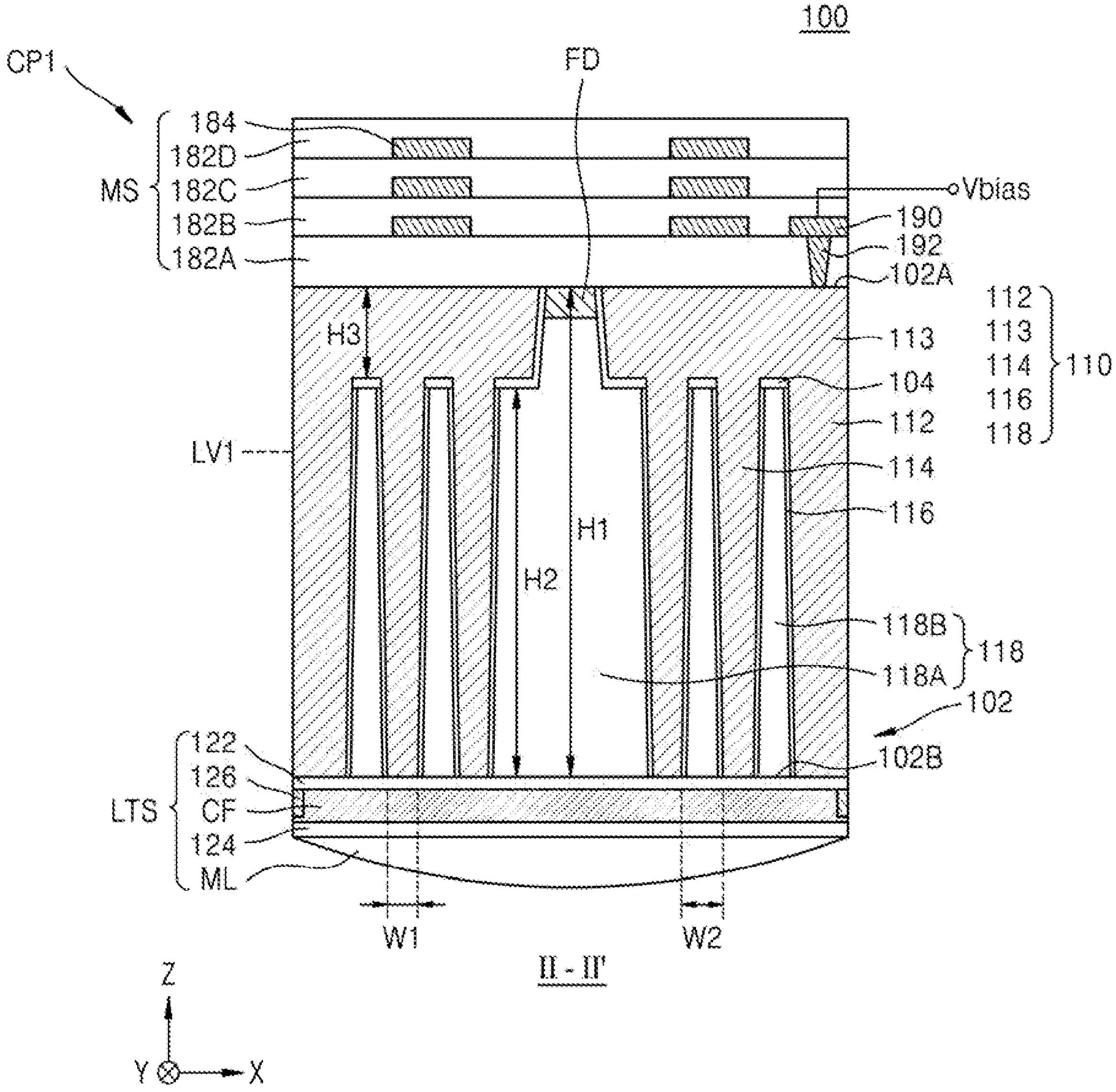

As shown in FIGS. 3B and 3C, an upper sidewall adjacent to the front-side surface 102A of the substrate 102 at each of the outer isolation layer 112 and the plurality of inner isolation layers 114 of the pixel isolation structure 110 may be covered by a local isolation layer 104. The local isolation layer 104 may include a silicon oxide layer.

Figure 3D:
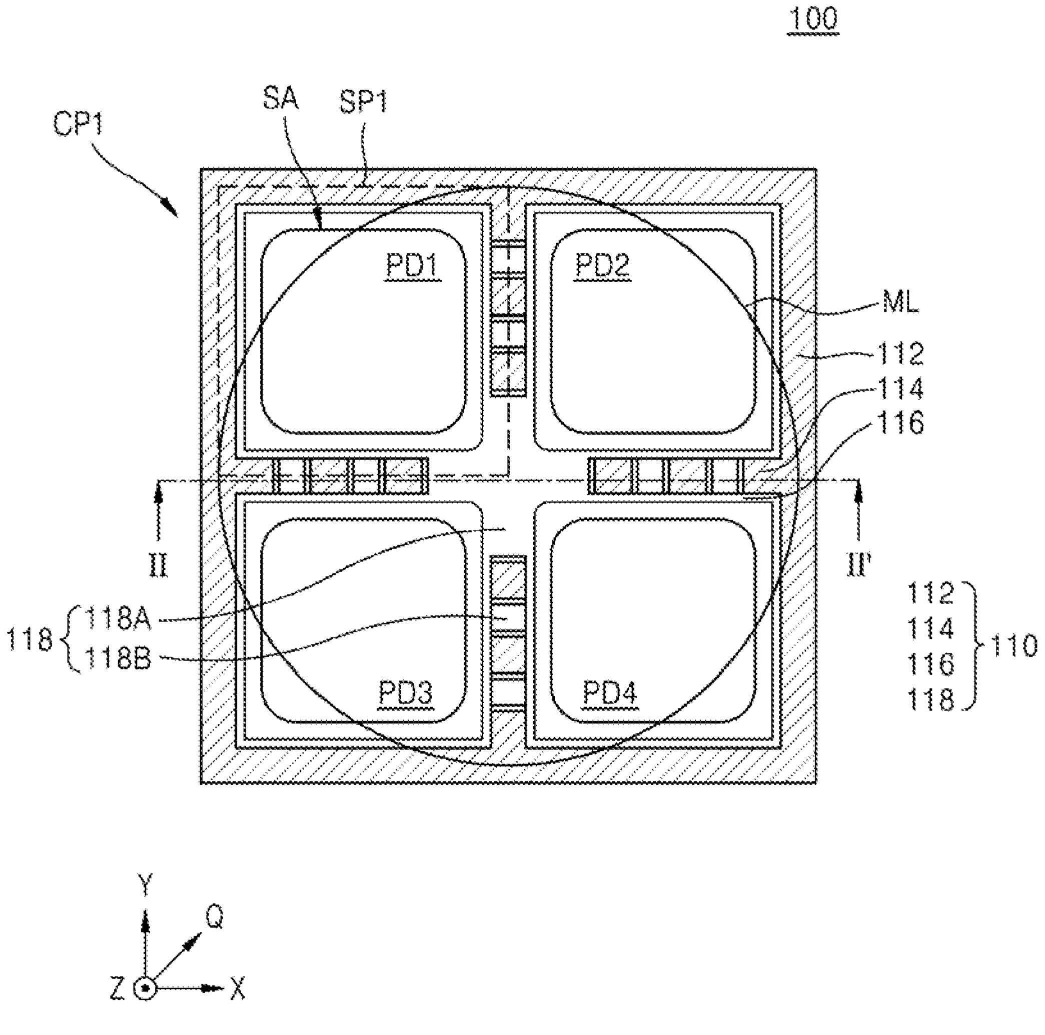

As shown in FIGS. 3C and 3D, in the pixel isolation structure 110, the outer isolation layer 112 and the plurality of inner isolation layers 114 may be connected as one body through the isolation layer connection portion 113, and the isolation liner 116 and the isolation pillar 118 may be connected as one body. In an implementation, one sidewall of each of the plurality of inner isolation layers 114 may be in contact with the outer isolation layer 112. In addition, sidewalls of at least some of the plurality of inner isolation layers 114 may be in contact with the first isolation pillar 118A.

As shown in FIG. 3C, in the pixel isolation structure 110, a height of the top surface of the isolation liner 116 and a height of the top surface of the isolation pillar 118 may be less than a height of the top surface of each of the outer isolation layer 112 and the plurality of inner isolation layers 114. In embodiments, the height of the top surface of the isolation liner 116 may differ from the height of the top surface of the isolation pillar 118. The isolation liner 116 may be separated by a first depth D6 from the front-side surface 102A of the substrate 102 in the vertical direction (the Z direction), and the isolation pillar 118 may be separated by a second depth D8 from the front-side surface 102A of the substrate 102 in the vertical direction (the Z direction). In embodiments, the first depth D6 may be greater than the second depth D8. In some embodiments, the first depth D6 may be less than the second depth D8. In some embodiments, the first depth D6 may be the same as or similar to the second depth D8.

A width of each of the outer isolation layer 112 and the plurality of inner isolation layers 114 in the horizontal direction (the X direction and/or the Y direction) may be greatest in a region adjacent to the front-side surface 102A of the substrate 102 and gradually decrease toward the backside surface 102B.

As shown in FIG. 3B, the floating diffusion region FD may overlap the first isolation pillar 118A in the vertical direction (the Z direction). The floating diffusion region FD may cover an upper surface of the first isolation pillar 118A. The local isolation layer 104 may overlap the isolation liner 116 in the vertical direction (the Z direction). The local isolation layer 104 may cover an upper surface of the isolation liner 116. A length of each of the isolation liner 116 and the first isolation pillar 118A may be less than a length of each of the outer isolation layer 112 and the plurality of inner isolation layers 114 in the vertical direction (the Z direction).

The first isolation pillar 118A may be separated from the front-side surface 102A of the substrate 102 in the vertical direction (the Z direction) with the floating diffusion region FD therebetween. The first isolation pillar 118A may have a pillar shape extending long in the vertical direction (the Z direction) from a lower surface of the floating diffusion region FD to the backside surface 102B of the substrate 102.

The second isolation pillar 118B may have a pillar shape extending long in the vertical direction (the Z direction) from an inner side of the isolation layer connection portion 113 to the backside surface 102B of the substrate 102. One or more second isolation pillars 118B may be inside one inner isolation layer 114. The second isolation pillar 118B may be arranged so that at least parts of two adjacent inner isolation layers 114 may be separated from each other in the horizontal direction (the X direction and/or the Y direction).

In embodiments, each of the outer isolation layer 112, the isolation layer connection portion 113, and the plurality of inner isolation layers 114 may include silicon oxide, silicon nitride, silicon carbon nitride (SiCN), silicon oxynitride (SiON), silicon oxycarbide (SiOC), silicon dioxide ($SiO_2$), polysilicon, a metal, metal nitride, metal oxide, borosilicate glass (BSG), phosphosilicate glass (PSG), borophosphosilicate glass (BPSG), plasma enhanced tetraethyl orthosilicate (PE-TEOS), fluoride silicate glass (FSG), carbon doped silicon oxide (CDO), organosilicate glass (OSG), or air. In the specification, the term "air" may indicate the atmosphere or other gases, which may exist during a manufacturing process. When at least one of the outer isolation layer 112, the isolation layer connection portion 113, and the plurality of inner isolation layers 114 includes a metal, the metal may include tungsten (W), or copper (Cu). When at least one of the outer isolation layer 112, the isolation layer connection portion 113, and the plurality of inner isolation layers 114 includes metal nitride, the metal nitride may include titanium nitride (TiN), or tantalum nitride (TaN). When at least one of the outer isolation layer 112, the isolation layer connection portion 113, and the plurality of inner isolation layers 114 includes metal oxide, the metal oxide may include indium tin oxide (ITO), or aluminum oxide ($Al_2O_3$).

In embodiments, each of the outer isolation layer 112, the isolation layer connection portion 113, and the plurality of inner isolation layers 114 may have a structure filled with polysilicon and covered by $SiO_2$.

In embodiments, each of the isolation liner 116 and/or the isolation pillar 118 may include silicon oxide, silicon nitride, and silicon oxynitride, and/or metal oxides such as hafnium oxide, aluminum oxide, tantalum oxide, and the like. In embodiments, the isolation pillar 118 may include undoped silicon.

In some embodiments, each of the isolation liner 116 and/or the isolation pillar 118 may include a silicon region doped with a P+-type impurity. In an implementation, each of the isolation liner 116 and the isolation pillar 118 may include a silicon region doped with boron (B) ions.

In embodiments, each of the isolation liner 116 and the isolation pillar 118 may reduce a dark current in a subpixel SP1, thereby improving the quality of the image sensor 100. The isolation liner 116 may reduce generation of a dark current due to electron-hole pairs generated by a surface defect between the outer isolation layer 112 and the isolation liner 116 and between the plurality of inner isolation layers 114 and the isolation liner 116.

As shown in FIGS. 3B and 3C, a wiring structure MS may be on the front-side surface 102A of the substrate 102. The wiring structure MS may include first to fourth interlayer insulating layers 182A, 182B, 182C, and 182D of a multi-layer structure, which cover a plurality of transfer transistors TX, and a plurality of wiring layers 184 of a multi-layer structure, which may be respectively formed on the first to fourth interlayer insulating layers 182A, 182B, 182C, and 182D.

The plurality of wiring layers 184 included in the wiring structure MS may include a plurality of transistors electrically connected to the first to fourth photodiodes PD1, PD2, PD3, and PD4 and wirings connected to the plurality of transistors. The plurality of wiring layers 184 may be freely arranged regardless of the arrangement of the first to fourth photodiodes PD1, PD2, PD3, and PD4.

A light-transmissive structure LTS may be under the backside surface 102B of the substrate 102. The light-transmissive structure LTS may include a first planarization layer 122, a plurality of color filters CF, a second planarization layer 124, and a microlenses ML sequentially stacked on the backside surface 102B. The light-transmissive structure LTS may concentrate and filter light incident from the outside and provide the light to the sensing area SA.

The plurality of color filters CF may be respectively arranged to correspond to the four subpixels SP1. Each of the plurality of color filters CF may cover the sensing area SA of a subpixel SP1 on the backside surface 102B of the substrate 102. The plurality of color filters CF included in one color pixel CP1 may have the same color. One microlens ML may be disposed to correspond to one color pixel CP1. The microlens ML may cover the four subpixels SP1 with the plurality of color filters CF therebetween. The first to fourth photodiodes PD1, PD2, PD3, and PD4 may be covered by one common microlens ML. Each of the four subpixels SP1 may have a backside illumination (BSI) structure in which light may be received from the backside surface 102B of the substrate 102. The microlens ML may have a shape convex outward to concentrate light incident to the first to fourth photodiodes PD1, PD2, PD3, and PD4. In the light-transmissive structure LTS, the first planarization layer 122 may be used as a buffer layer for preventing the substrate 102 from being damaged during a process of manufacturing the image sensor 100. Each of the first planarization layer 122 and the second planarization layer 124 may include a silicon oxide layer, a silicon nitride layer, or a resin.

In embodiments, each of the plurality of color filters CF may include a green color filter, a red color filter, or a blue color filter. In some embodiments, the plurality of color filters CF may include other color filters, such as a cyan color filter, a magenta color filter, and a yellow color filter.

In embodiments, the light-transmissive structure LTS may further include a partition 126 on the first planarization layer 122. The partition 126 may be at a position where the partition 126 overlaps the pixel isolation structure 110 in the vertical direction (the Z direction). An lower surface and a sidewall of the partition 126 may be covered by a color filter CF. The partition 126 may prevent incident light passing through the color filter CF from being reflected or scattered to a side surface. In an implementation, the partition 126 may prevent photons reflected or scattered on an interface between the color filter CF and the first planarization layer 122 from moving to another sensing area SA. In embodiments, the partition 126 may include a metal. In an implementation, the partition 126 may include tungsten (W), aluminum (Al), or copper (Cu).

As shown in FIGS. 3B and 3C, each of the first to fourth photodiodes PD1, PD2, PD3, and PD4 may include a first semiconductor region 132, a second semiconductor region 134, and a junction between the first semiconductor region 132 and the second semiconductor region 134. The first semiconductor region 132 may be a semiconductor region doped with a P-type impurity and may be adjacent to the front-side surface 102A of the substrate 102. The first semiconductor region 132 may be used as a hole accumulated device (HAD) region. An impurity concentration of the first semiconductor region 132 may be greater than an impurity concentration of a P-type semiconductor layer constituting the substrate 102. The second semiconductor region 134 may be a semiconductor region doped with an N-type impurity and may be in contact with the first semiconductor region 132 at a position separated from the front-side surface 102A of the substrate 102 with the first semiconductor region 132 therebetween.

As shown in FIG. 3B, a transfer transistor TX included in one subpixel SP1 may include a gate dielectric layer 142, a transfer gate 144, and a channel region CH. The channel region CH may be at a position of the substrate 102 adjacent to the gate dielectric layer 142. On the front-side surface 102A of the substrate 102, sidewalls of each of the gate dielectric layer 142 and the transfer gate 144 may be covered by an insulating spacer 146. In embodiments, the gate dielectric layer 142 may include a silicon oxide layer. In embodiments, the transfer gate 144 may include at least one of doped polysilicon, a metal, metal silicide, metal nitride, and a metal-containing layer. In an implementation, the transfer gate 144 may include polysilicon doped with an N-type impurity, such as phosphorous (P) or arsenic (As). In embodiments, the insulating spacer 146 may include a silicon oxide layer, a silicon nitride layer, or a silicon oxynitride layer. A constituent material may be included in each of the gate dielectric layer 142, the transfer gate 144, or the insulating spacer 146.

The transfer gate 144 of each of the plurality of transfer transistors TX may transfer, to the floating diffusion region FD, photocharges generated by the first to fourth photodiodes PD1, PD2, PD3, and PD4. The present embodiment illustrates a recess channel transistor structure in which a part of the transfer gate 144 of each of the plurality of transfer transistors TX may be buried inward from the front-side surface 102A of the substrate 102.

In the four subpixels SP1, the first to fourth photodiodes PD1, PD2, PD3, and PD4 may generate photocharges by receiving light having passed through one microlens ML covering the backside surface 102B of the substrate 102, and these generated photocharges may be accumulated in the first to fourth photodiodes PD1, PD2, PD3, and PD4 to generate first to fourth pixel signals. In the four subpixels SP1, auto-focusing information may be extracted from the first to fourth pixel signals output from the first to fourth photodiodes PD1, PD2, PD3, and PD4.

The image sensor 100 described with reference to FIGS. 1 to 3D may include the pixel isolation structure 110 constructed to isolate each of the four subpixels SP1 included in the color pixel CP1. The pixel isolation structure 110 may include the outer isolation layer 112, the plurality of isolation layer connection portions 113, the plurality of inner isolation layers 114, the isolation liner 116, and the isolation pillar 118. The outer isolation layer 112 may surround the color pixel CP1. The plurality of isolation layer connection portions 113 may be constructed to connect the outer isolation layer 112 to the plurality of inner isolation layers 114. The plurality of inner isolation layers 114 may include a part between two adjacent subpixels SP1 among the four subpixels SP1 in a region limited by the outer isolation layer 112. The isolation liner 116 may cover both sidewalls of each of the plurality of inner isolation layers 114. The isolation pillar 118 may be in contact with the four subpixels SP1 included in one color pixel CP1 and limit a size of a partial region of each of the four subpixels SP1 together with the plurality of inner isolation layers 114.

In a process of manufacturing the image sensor 100, a process of forming the outer isolation layer 112, the isolation layer connection portion 113, and the plurality of inner isolation layers 114 may be separately performed from a process of forming the isolation pillar 118. In addition, the image sensor 100 may include the second isolation pillar 118B separating at least parts of adjacent two of the plurality of inner isolation layers 114 from each other in the horizontal direction (the X direction and/or the Y direction), thereby reducing a blooming effect that charges of a pixel exceed a saturation level.

Figure 4:
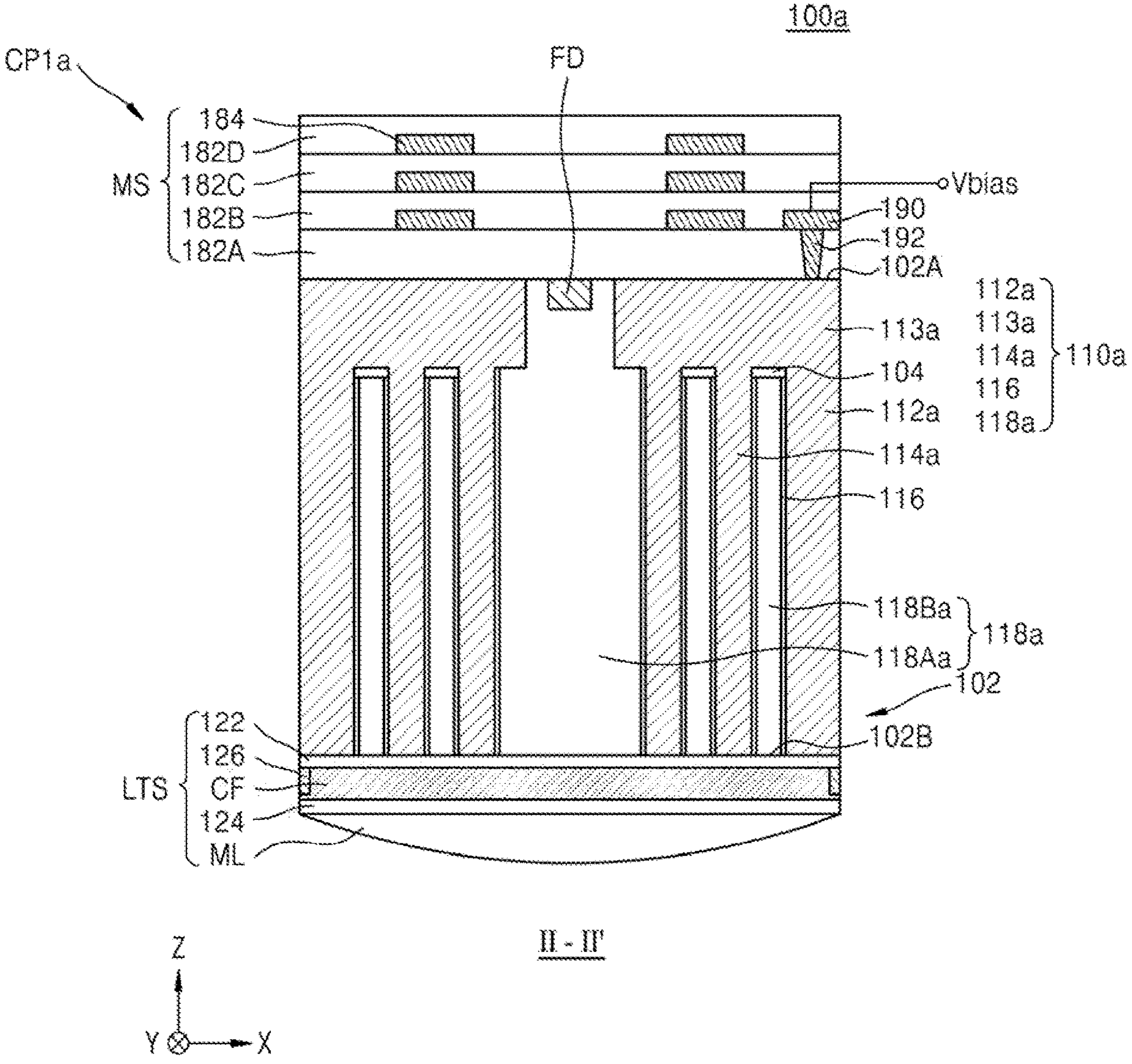
FIG. 4 is a cross-sectional view of an image sensor according to example embodiments, taken along line II-II' of FIG. 3A.

In addition, the outer isolation layer 112 may be electrically connected to the plurality of inner isolation layers 114 via the isolation layer connection portion 113, and thus, even when the bias voltage Vbias is applied to the outer isolation layer 112, the bias voltage Vbias may be applied to each of the plurality of inner isolation layers 114. FIG. 4 is a cross-sectional view of an image sensor 100*a* according to example embodiments, taken along line II-II' of FIG. 3A. An example construction of a color pixel CP1*a* included in the image sensor 100*a* may be described with reference to FIG. 4. In FIG. 4, like reference numerals in FIGS. 3A to 3D denote like elements, and thus their detailed description is omitted herein.

Figure 5A:
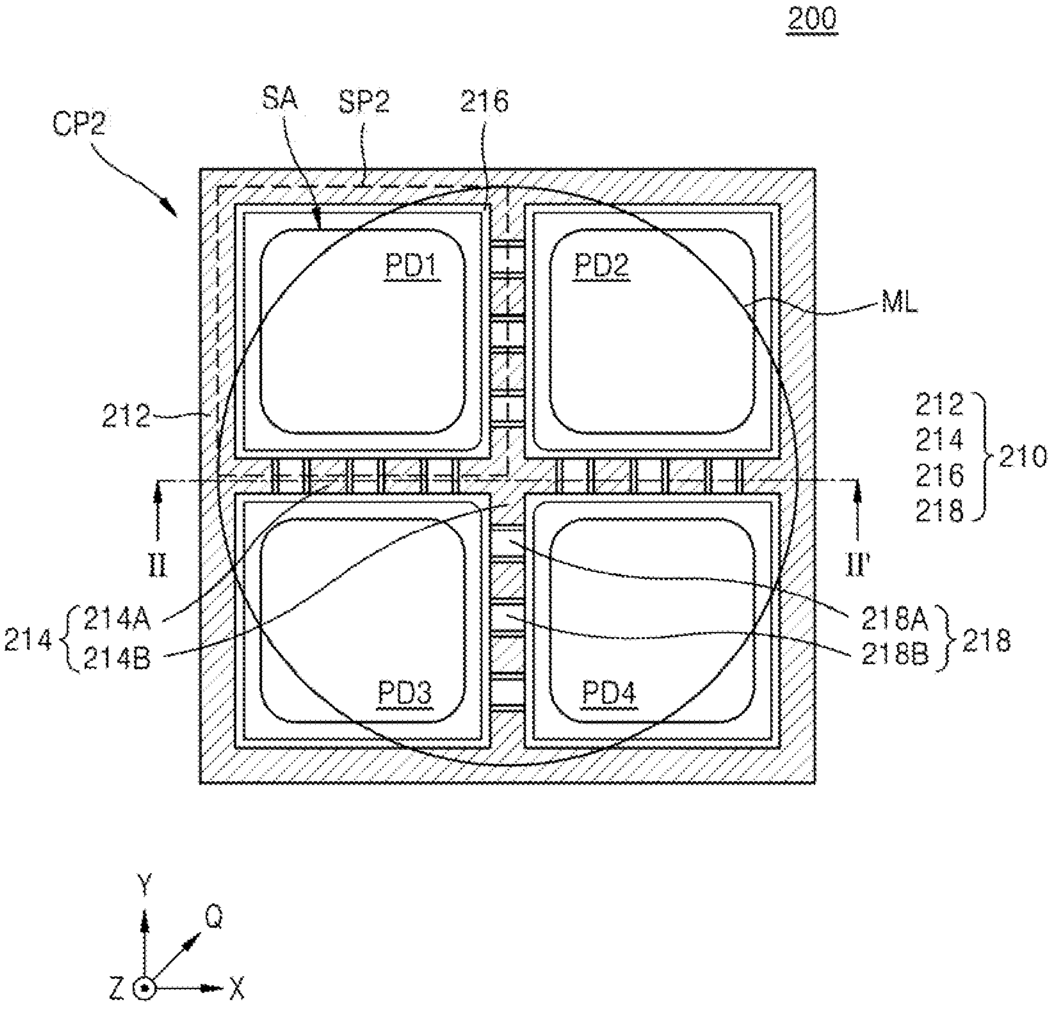
FIG. 5A is a top view of an image sensor according to an example embodiment.

Referring to FIG. 4, a pixel isolation structure 110*a* may include an outer isolation layer 112*a*, an isolation layer connection portion 113*a*, an inner isolation layer 114*a*, the isolation liner 116, and an isolation pillar 118*a*. In the pixel isolation structure 110*a*, the outer isolation layer 112*a* and the inner isolation layer 114*a* may penetrate the substrate 102 in the vertical direction (the Z direction) from the front-side surface 102A of the substrate 102 to the backside surface 102B. Each of the outer isolation layer 112*a* and the inner isolation layer 114*a* may penetrate at least a part of the substrate 102 in the vertical direction (the Z direction) while constantly maintaining a width of each of the outer isolation layer 112*a* and the inner isolation layer 114*a* in the horizontal direction (the X direction and/or the Y direction). In addition, each of the isolation layer connection portion 113*a* and the isolation pillar 118*a* may also penetrate at least a part of the substrate 102 in the vertical direction (the Z direction) while constantly maintaining a width of each of the isolation layer connection portion 113*a* and the isolation pillar 118*a* in the horizontal direction (the X direction and/or the Y direction). The isolation pillar 118*a* include a first isolation pillar 118Aa and a second isolation pillar 118Ba. FIG. 5A is a top view of an image sensor 200 according to example embodiments, and FIG. 5B is a cross-sectional view taken along line of FIG. 5A.

Figure 5B:
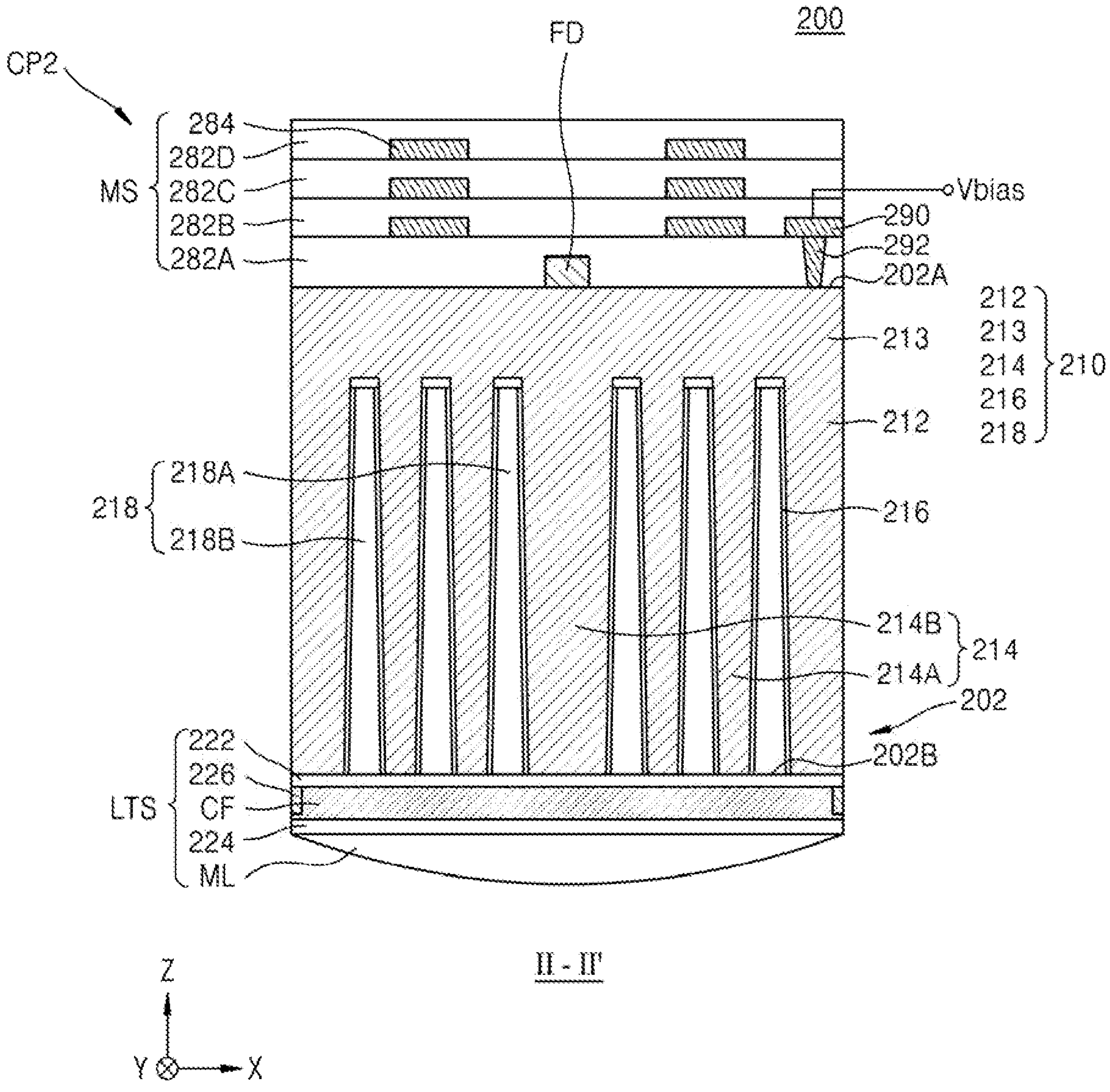
FIG. 5B is a cross-sectional view taken along line II-II' of FIG. 5A.

FIGS. 5A and 5B show some components of the image sensor 200 at a vertical level corresponding to the vertical level LV1 shown in FIGS. 3B and 3C. An example construction of a color pixel CP2 included in the image sensor 200 may be described with reference to FIGS. 5A and 5B. In FIGS. 5A and 5B, like reference numerals in FIGS. 3A to 3D denote like elements, and thus their detailed description is omitted herein.

Referring to FIGS. 5A and 5B, the image sensor 200 may have generally the same construction as the image sensor 100 described with reference to FIGS. 3A to 3D. However, the image sensor 200 may include the color pixel CP2 including four subpixels SP2 arranged in a 2×2 matrix, and a pixel isolation structure 210 constructed to isolate each of the four subpixels SP2 in the color pixel CP2.

The four subpixels SP2 included in one color pixel CP2 may include the sensing area SA limited by an outer isolation layer 212. In an implementation, the outer isolation layer 212 may limit the sensing area SA by surrounding it, so that it may not extend outside its area in the color pixel CP2. The sensing area SA may be an area in which light incident from the outside of the four subpixels SP2 is sensed. The four subpixels SP2 included in one color pixel CP2 may have the same color.

The pixel isolation structure 210 may be constructed to isolate each of the four subpixels SP2 in the color pixel CP2. The pixel isolation structure 210 may include the outer isolation layer 212, an isolation layer connection portion 213, an inner isolation layer 214, an isolation liner 216, and a plurality of isolation pillars 218.

The outer isolation layer 212, the isolation layer connection portion 213, the plurality of inner isolation layers 214, the isolation liner 216, and the plurality of isolation pillars 218 constituting the pixel isolation structure 210 may have generally the same constructions as the outer isolation layer 112, the plurality of isolation layer connection portions 113, the plurality of inner isolation layers 114, the isolation liner 116, and the isolation pillar 118 described with reference to FIGS. 3A to 3D. However, the plurality of inner isolation layers 214 may include a plurality of first inner isolation layers 214A arranged adjacent to the outer isolation layer 212, and a second inner isolation layer 214B arranged adjacent to the center of the color pixel CP2. At least a part of a first inner isolation layer 214A may be separated from at least a part of the second inner isolation layer 214B in the horizontal direction (the X direction and/or the Y direction).

The isolation layer connection portion 213 may extend from an inner surface of the outer isolation layer 212 toward the center of the color pixel CP2. The isolation layer connection portion 213 may have a cross shape in a top view. In the specification, the isolation layer connection portion 213 may be referred to as a cross-shaped isolation layer connection portion.

Each of the plurality of first inner isolation layers 214A and the second inner isolation layer 214B may have a pillar shape extending in a vertical downward direction from a lower surface of the isolation layer connection portion 213. A part adjacent to a lower surface of each of the plurality of first inner isolation layers 214A may be separated from a part adjacent to a lower surface of the second inner isolation layer 214B in the horizontal direction (the X direction and/or the Y direction).

The outer isolation layer 212, the plurality of first inner isolation layers 214A, and the second inner isolation layer 214B may be connected to each other through the isolation layer connection portions 213. In an implementation, the outer isolation layer 212, the plurality of first inner isolation layers 214A, and the second inner isolation layer 214B may be electrically connected to each other via the isolation layer connection portions 213. In an implementation, when the bias voltage Vbias is applied to the outer isolation layer 212, the bias voltage Vbias may be applied to each of the plurality of first inner isolation layers 214A and the second inner isolation layer 214B.

In addition, the outer isolation layer 212 may be electrically connected to the plurality of inner isolation layers 214 via the isolation layer connection portion 213, and thus, even when the bias voltage Vbias is applied to the outer isolation layer 212, the bias voltage Vbias may be applied to each of the plurality of inner isolation layers 214. In particular, even when the bias voltage Vbias is applied to the outer isolation layer 212, the bias voltage Vbias may be applied to the second inner isolation layer 214B via the isolation layer connection portion 213.

The pixel isolation structure 210 may include the plurality of isolation pillars 218 separated from each other. The plurality of isolation pillars 218 may include a plurality of first isolation pillars 218A between first inner isolation layers 214A and the second inner isolation layer 214B, and a plurality of second isolation pillars 218B between every two of the plurality of first inner isolation layers 214A.

The plurality of inner isolation layers 214 may include 12 first inner isolation layers 214A and one second inner isolation layer 214B. The second inner isolation layer 214B may be arranged at an approximately central part of the color pixel CP2. The second inner isolation layer 214B may have a cross shape on an X-Y plane. In the specification, the second inner isolation layer 214B may be referred to as a cross-shaped inner isolation layer.

In the pixel isolation structure 210, each of the plurality of isolation pillars 218 may be in contact with a photodiode of each of two selected from among the four subpixels SP2 included in one color pixel CP2. The plurality of first inner isolation layers 214A may be between two selected from among the four subpixels SP2 included in one color pixel CP2 and integrally connected to the outer isolation layer 212. The plurality of first inner isolation layer 214A may include parts between two of the four subpixels SP2 and be integrally connected to the isolation layer connection portion 213. At least a part of the second inner isolation layer 214B may be separated from at least a part of a first inner isolation layer 214A with a first isolation pillar 218A in the horizontal direction (the X direction and/or the Y direction).

The isolation liner 216 may be integrally connected to the plurality of isolation pillars 218. Similarly to the isolation pillar 118 described with reference to FIG. 3B, each of the plurality of isolation pillars 218 may have a pillar shape extending long to the backside surface 102B of the substrate 102 by passing through a part of the substrate 102 in the vertical direction (the Z direction). The image sensor 200 may further include the floating diffusion region FD disposed to overlap the second inner isolation layer 214B in the vertical direction (the Z direction). In an implementation, the floating diffusion region FD may be on the wiring structure MS. The floating diffusion region FD may be inside the isolation layer connection portion 213.

In embodiments, each of the isolation liner 216 and/or the isolation pillar 218 may include silicon oxide, silicon nitride, and silicon oxynitride, and/or metal oxides such as hafnium oxide, aluminum oxide, tantalum oxide, and the like. In embodiments, the isolation pillar 218 may include undoped silicon. In embodiments, each of the isolation liner 216 and/or the plurality of isolation pillars 218 may include a silicon region doped with a P+-type impurity. In an implementation, each of the isolation liner 216 and the plurality of isolation pillars 218 may include a silicon region doped with boron (B) ions.

In embodiments, each of the isolation liner 216 and the plurality of isolation pillars 218 may reduce a dark current in each subpixel SP2, thereby improving the quality of the image sensor 200. The isolation liner 216 may reduce generation of a dark current due to electron-hole pairs generated by a surface defect between the outer isolation layer 212 and the isolation liner 216 and between the plurality of inner isolation layers 214 and the isolation liner 216.

Figure 6A:
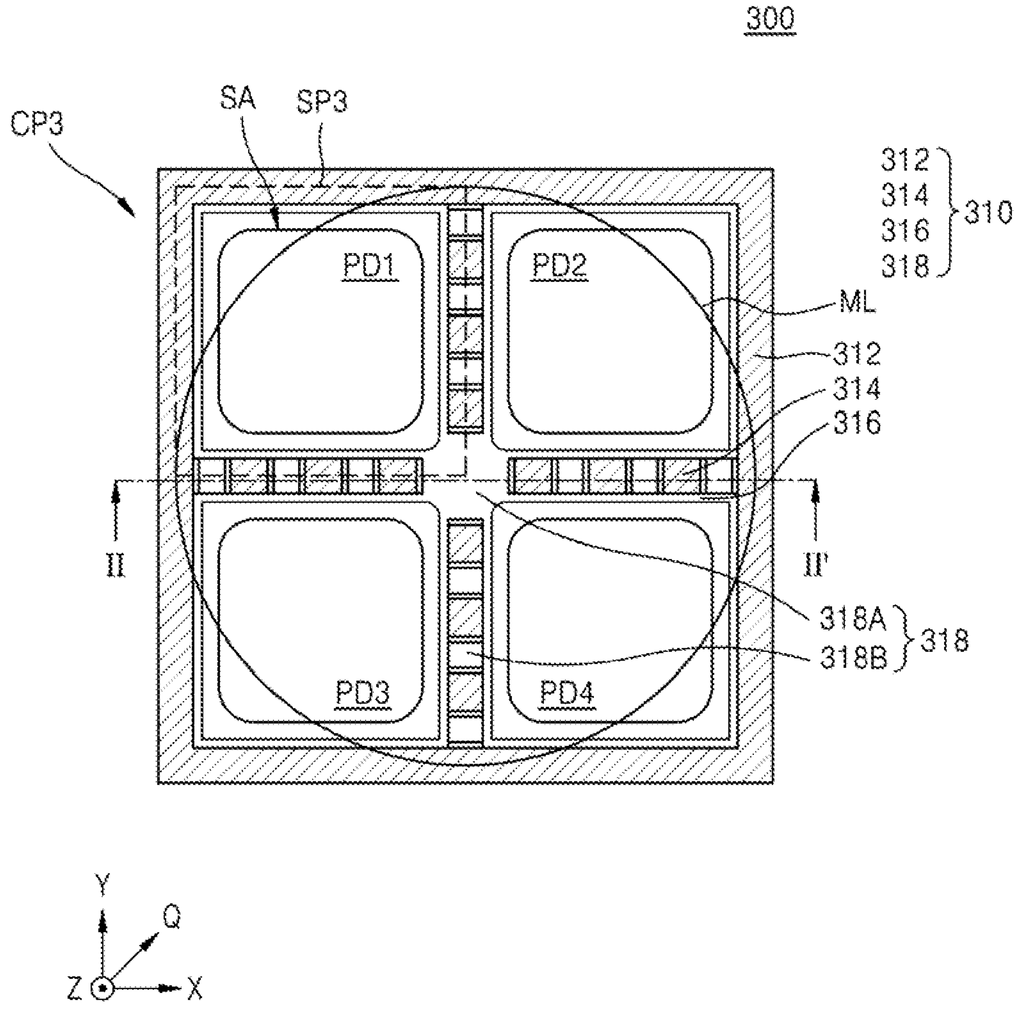
FIG. 6A is a top view of an image sensor according to an example embodiment.
Figure 6B:
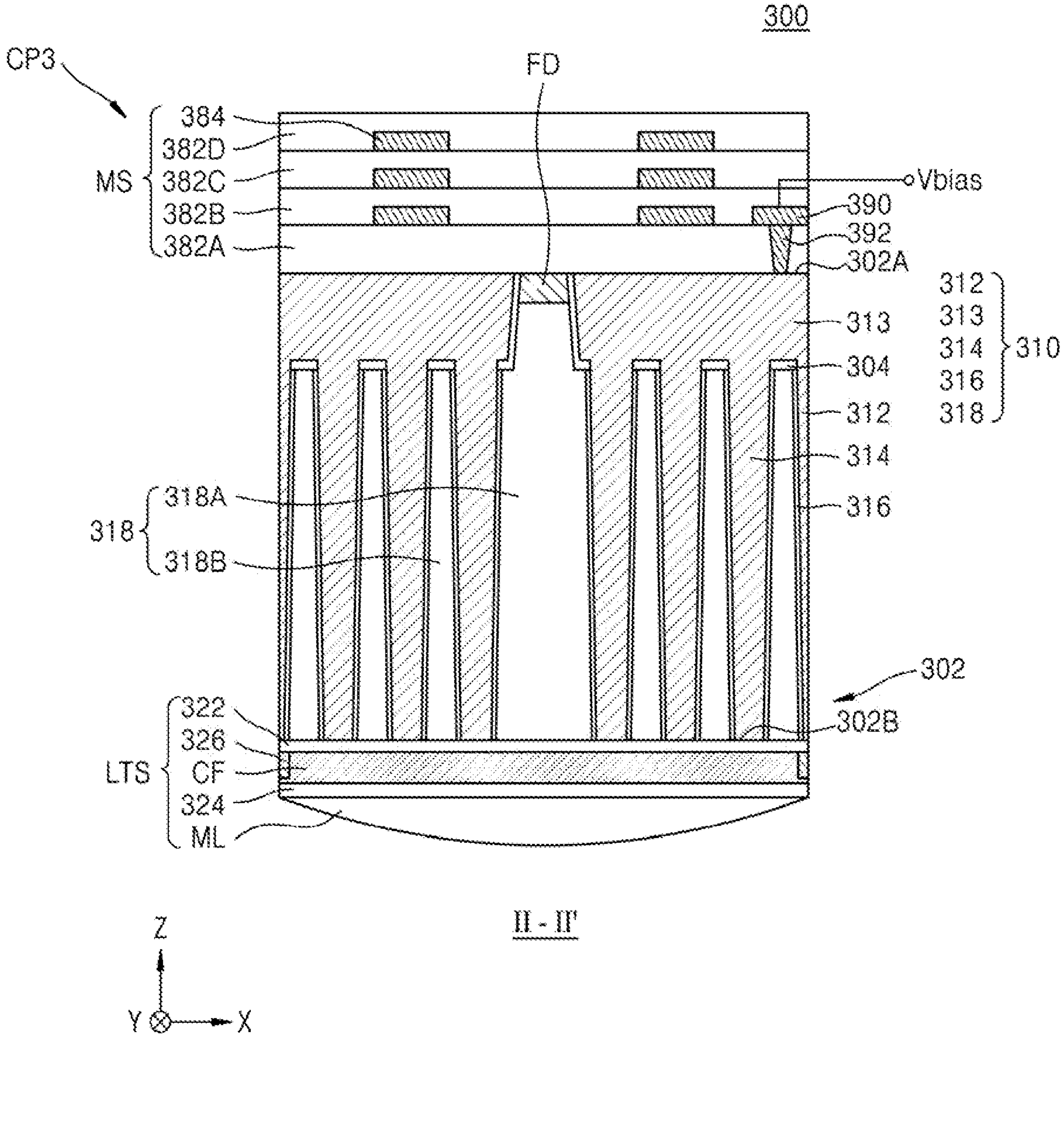
FIG. 6B is a cross-sectional view taken along line II-II' of FIG. 6A.

FIG. 6A is a top view of an image sensor 300 according to an example embodiment, and FIG. 6B is a cross-sectional view taken along line II-II' of FIG. 6A. FIGS. 6A and 6B show some components of the image sensor 300 at a vertical level corresponding to the vertical level LV1 shown in FIGS. 3B and 3C. An example construction of a color pixel CP3 included in the image sensor 300 may be described with reference to FIGS. 6A and 6B. In FIGS. 6A and 6B, like reference numerals in FIGS. 3A to 3D denote like elements, and thus their detailed description is omitted herein.

Referring to FIGS. 6A and 6B, the image sensor 300 may have generally the same construction as the image sensor 100 described with reference to FIGS. 3A to 3D. However, the image sensor 300 may include the color pixel CP3 including four subpixels SP3 arranged in a 2×2 matrix, and a pixel isolation structure 310 constructed to isolate each of the four subpixels SP3 in the color pixel CP3.

Referring to FIGS. 6A and 6B, the pixel isolation structure 310 may include an outer isolation layer 312, an isolation layer connection portion 313, an inner isolation layer 314, an isolation liner 316, and an isolation pillar 318.

The isolation pillar 318 may include one first isolation pillar 318A arranged adjacent to the center of the color pixel CP3, and a plurality of second isolation pillars 318B separated from the first isolation pillar 318A in the horizontal direction (the X direction and/or the Y direction).

The first isolation pillar 318A may be in contact with four subpixels SP3 included in one color pixel CP3 and limit a size of a partial region of each of the four subpixels SP3 together with the plurality of inner isolation layers 314.

A second isolation pillar 318B may be between the outer isolation layer 312 and the inner isolation layer 314. Therefore, the second isolation pillar 318B may be between at least a part of the outer isolation layer 312 and at least a part of each of a plurality of inner isolation layers 314. Therefore, the outer isolation layer 312 may be connected to each of the plurality of inner isolation layers 314 through the isolation layer connection portion 313. In an implementation, the outer isolation layer 312 may be electrically connected to each of the plurality of inner isolation layers 314 via the isolation layer connection portion 313. The outer isolation layer 312 and the plurality of inner isolation layers 314 may be integrally formed. Each of the plurality of inner isolation layers 314 may be separated from the outer isolation layer 312 in the horizontal direction (the X direction and/or the Y direction).

An upper surface of the outer isolation layer 312 may be connected to upper surfaces of the plurality of inner isolation layers 314 through the isolation layer connection portion 313. In an implementation, the upper surface of the outer isolation layer 312 may be electrically connected to the upper surfaces of the plurality of inner isolation layers 314 via the isolation layer connection portion 313. In an implementation, when the bias voltage Vbias is applied to the outer isolation layer 312, the bias voltage Vbias may be applied to each of the plurality of inner isolation layers 314.

In addition, the outer isolation layer 312 may be electrically connected to the plurality of inner isolation layers 314 via the isolation layer connection portion 313, and thus, even when the bias voltage Vbias is applied to the outer isolation layer 312, the bias voltage Vbias may be applied to each of the plurality of inner isolation layers 314. The image sensor 300 may further include the floating diffusion region FD disposed to overlap at least parts of a plurality of isolation pillars 318 in the vertical direction (the Z direction).

Figure 7A:
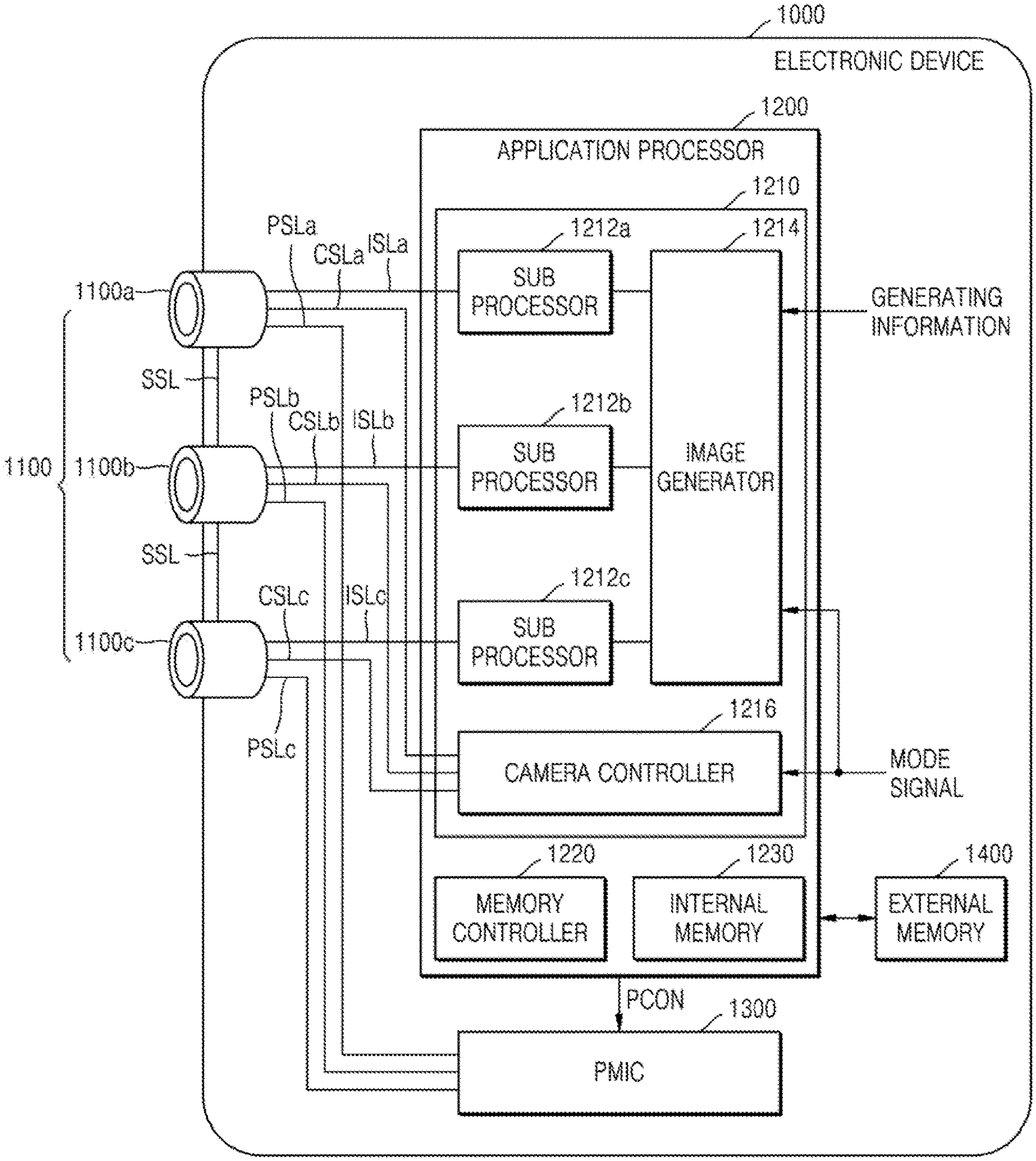
FIG. 7A is a block diagram of an electronic device according to example embodiments.
Figure 7B:
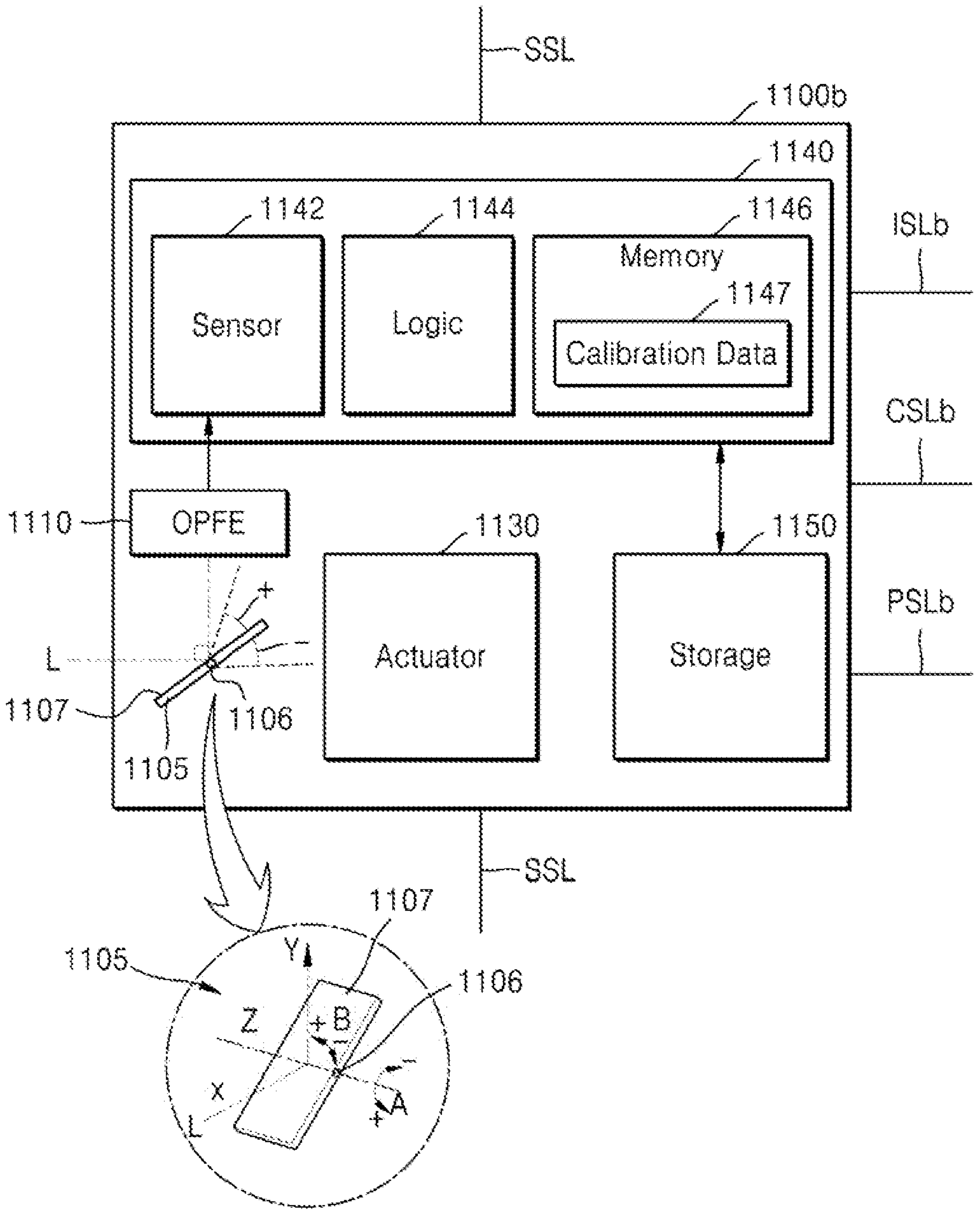
FIG. 7B is a detailed block diagram of a camera included in the electronic device of FIG. 7A.

FIG. 7A is a block diagram of an electronic device 1000 according to example embodiments, and FIG. 7B is a detailed block diagram of a camera 1100*b* included in the electronic device 1000 of FIG. 7A. Referring to FIG. 7A, the electronic device 1000 may include a camera group 1100, an application processor 1200, a power management integrated circuit (PMIC) 1300, and an external memory 1400.

The camera group 1100 may include a plurality of camera 1100*a*, 1100*b*, and 1100*c*. FIG. 7A shows an embodiment of three camera 1100*a*, 1100*b*, and 1100*c*. In some embodiments, the camera group 1100 may be modified and include only two cameras. Alternatively, in some embodiments, the camera group 1100 may be modified and include n (n is a natural number greater than or equal to 4) cameras.

A detailed construction of the camera 1100*b* is described below in more detail with reference to FIG. 7B, and the description to be made below may also be applied to the other cameras 1100*a* and 1100*c*.

Referring to FIG. 7B, the camera 1100*b* may include a prism 1105, an optical path folding element (OPFE) 1110, an actuator 1130, an image sensing device 1140, and a storage 1150.

The prism 1105 may include a reflective surface 1107 of a light reflective material to change a path of light L incident from the outside.

In some embodiments, the prism 1105 may change a path of the light L incident in a first direction (an X direction in FIG. 7B) to a second direction (a Y direction in FIG. 7B) that may be perpendicular to the first direction. In addition, the prism 1105 may change a path of the light L incident in the first direction (the X direction) to the second direction (the Y direction) that may be perpendicular to the first direction by rotating the reflective surface 1107 of a light reflective material in an A direction around a central axis 1106 or rotating the central axis 1106 in a B direction. In this case, the OPFE 1110 may also move in a third direction (a Z direction in FIG. 7B) that may be perpendicular to the first direction (the X direction) and the second direction (the Y direction).

In some embodiments, as shown in FIG. 7B, a maximum rotating angle of the prism 1105 in the A direction may be 15 degrees or less in a +A direction and greater than 15 degrees in a −A direction.

In some embodiments, the prism 1105 may move at about 20 degrees, between 10 degrees and 20 degrees, or between 15 degrees and 20 degrees in a + or −B direction, wherein the moving angles in the + and −B directions may be the same or similar in a range of about one degree.

In some embodiments, the prism 1105 may move the reflective surface 1107 of a light reflective material in the third direction (e.g., the Z direction) parallel to an extending direction of the central axis 1106.

The OPFE 1110 may include, e.g., a group of m (m is a natural number) optical lenses. The m optical lenses may move in the second direction (the Y direction) to change an optical zoom ratio of the camera 1100*b*. In an implementation, assuming that a default optical zoom ratio of the camera 1100*b* is Z, if the m optical lenses included in the OPFE 1110 move, the optical zoom ratio of the camera 1100*b* may change to 3Z, 5Z, or greater than 5Z.

The actuator 1130 may move the OPFE 1110 or the m optical lenses (hereinafter, referred to as an optical lens) to a particular position. In an implementation, the actuator 1130 may adjust a position of the optical lens so that an image sensor 1142 is positioned at a focal length of the optical lens for accurate sensing.

The image sensing device 1140 may include the image sensor 1142, a control logic 1144, and a memory 1146. The image sensor 1142 may sense an image of an object to be sensed, by using the light L provided through the optical lens. The control logic 1144 may control a general operation of the camera 1100*b*. In an implementation, the control logic 1144 may control an operation of the camera 1100*b* in response to a control signal provided through a control signal line CSLb.

The memory 1146 may store information, such as calibration data 1147, required for an operation of the camera 1100*b*. The calibration data 1147 may be information required for the camera 1100*b* to generate image data by using the light L provided from the outside. The calibration data 1147 may include, e.g., information regarding a degree of rotation, information regarding a focal length, information regarding an optical axis, and the like. When the camera 1100*b* is implemented in the form of a multi-state camera of which a focal length varies according to a position of the optical lens, the calibration data 1147 may include a focal length value per position (or per state) of the optical lens and information regarding autofocusing.

The storage 1150 may store image data sensed by the image sensor 1142. The storage 1150 may be outside the image sensing device 1140 and be implemented in a stacked form with a sensor chip constituting the image sensing device 1140. In some embodiments, the storage 1150 may be implemented by electrically erasable programmable read-only memory (EEPROM).

The image sensor 1142 may include the image sensor 100, 100*a*, 200, or 300 described with reference to FIGS. 1 to 6B or an image sensor variously modified and changed.

Referring to FIGS. 7A and 7B, in some embodiments, each of the plurality of cameras 1100*a*, 1100*b*, and 1100*c* may include the actuator 1130. Accordingly, each of the plurality of cameras 1100*a*, 1100*b*, and 1100*c* may include the same or different calibration data 1147 according to an operation of the actuator 1130 included therein.

In some embodiments, one (e.g., the camera 1100*b*) of the plurality of cameras 1100*a*, 1100*b*, and 1100*c* may be a folded lens-type camera including the prism 1105 and the OPFE 1110 described above, and the other cameras (e.g., the cameras 1100*a* and 1100*c*) may be vertical-type cameras.

In some embodiments, one (e.g., the camera 1100*c*) of the plurality of cameras 1100*a*, 1100*b*, and 1100*c* may be, e.g., a vertical-type depth camera configured to extract depth information by using an infrared (IR) ray. In this case, the application processor 1200 may generate a three-dimensional (3D) depth image by merging image data received from the depth camera with image data received from another camera (e.g., the camera 1100*a* or 1100*b*).

In some embodiments, at least two (e.g., the cameras 1100*a* and 1100*b*) of the plurality of cameras 1100*a*, 1100*b*, and 1100*c* may have different fields of view. In this case, e.g., optical lenses of the at least two (e.g., the cameras 1100*a* and 1100*b*) of the plurality of cameras 1100*a*, 1100*b*, and 1100*c* may differ from each other.

In addition, in some embodiments, the fields of view of the plurality of cameras 1100*a*, 1100*b*, and 1100*c* may differ from each other. In this case, the optical lenses respectively included in the plurality of cameras 1100*a*, 1100*b*, and 1100*c* may also differ from each other.

In some embodiments, the plurality of cameras 1100*a*, 1100*b*, and 1100*c* may be physically separated from each other. In an implementation, instead that a sensing area of one image sensor 1142 is divided and used by the plurality of cameras 1100*a*, 1100*b*, and 1100*c*, an independent image sensor 1142 may be inside each of the plurality of cameras 1100*a*, 1100*b*, and 1100*c*.

Referring back to FIG. 7A, the application processor 1200 may include an image processing device 1210, a memory controller 1220, and an internal memory 1230. The application processor 1200 may be implemented by being separated from the plurality of cameras 1100*a*, 1100*b*, and 1100*c*. In an implementation, the application processor 1200 may be implemented by a separate semiconductor chip separated from the plurality of cameras 1100*a*, 1100*b*, and 1100*c*.

The image processing device 1210 may include a plurality of sub-image processors 1212*a*, 1212*b*, and 1212*c*, an image generator 1214, and a camera controller 1216. The image processing device 1210 may include the plurality of sub-image processors 1212*a*, 1212*b*, and 1212*c* corresponding in number to the plurality of cameras 1100*a*, 1100*b*, and 1100*c*.

Image data generated from the plurality of cameras 1100*a*, 1100*b*, and 1100*c* may be provided to the plurality of sub-image processors 1212*a*, 1212*b*, and 1212*c* corresponding thereto through image signal lines ISLa, ISLb, and ISLc separated from each other, respectively. In an implementation, image data generated by the camera 1100*a* may be provided to the sub-image processor 1212*a* through the image signal line ISLa, image data generated by the camera 1100*b* may be provided to the sub-image processor 1212*b* through the image signal line ISLb, and image data generated by the camera 1100*c* may be provided to the sub-image processor 1212*c* through the image signal line ISLc. This image data transmission may be performed by using, e.g., a camera serial interface (CSI) based on a mobile industry processor interface (MIPI). However, in some embodiments, one sub-image processor may correspond to a plurality of cameras. In an implementation, instead that the sub-image processor 1212*a* and the sub-image processor 1212*c* may be separated from each other as shown in FIG. 7A, the sub-image processor 1212*a* and the sub-image processor 1212*c* may be integrated into one sub-image processor, one of pieces of image data provided from the camera 1100*a* and the camera 1100*c* may be selected by a select element (e.g., a multiplexer) or the like and then provided to the integrated sub-image processor.

Image data provided to each sub-image processor 1212*a*, 1212*b*, or 1212*c* may be provided to the image generator 1214. The image generator 1214 may generate an output image by using the image data received from each sub-image processor 1212*a*, 1212*b*, or 1212*c* according to image generating information or a mode signal.

Particularly, the image generator 1214 may generate an output image by merging at least some of pieces of image data generated by the plurality of cameras 1100*a*, 1100*b*, and 1100*c* having different fields of view, according to the image generating information or the mode signal. Alternatively, the image generator 1214 may generate an output image by selecting any one of pieces of image data generated by the plurality of cameras 1100*a*, 1100*b*, and 1100*c* having different fields of view, according to the image generating information or the mode signal.

In some embodiments, the image generating information may include a zoom signal or a zoom factor. In addition, in some embodiments, the mode signal may be, e.g., a signal based on a mode selected by a user.

If the image generating information is a zoom signal (zoom factor), and the plurality of cameras 1100*a*, 1100*b*, and 1100*c* have different fields of view, the image generator 1214 may perform a different operation according to a type of the zoom signal. In an implementation, if the zoom signal is a first signal, an output image may be generated by merging image data output from the camera 1100*a* and image data output from the camera 1100*c* and then using a merged image signal and image data output from the camera 1100*b* not used for the merging. If the zoom signal is a second signal that is different from the first signal, the image generator 1214 may generate an output image by selecting one of image data output from the camera 1100*a*, image data output from the camera 1100*b*, and image data output from the camera 1100*c* without performing the image data merging.

In some embodiments, the image generator 1214 may receive a plurality of pieces of image data with different exposure times from at least one of the plurality of sub-image processors 1212*a*, 1212*b*, and 1212*c* and generate dynamic range-enhanced merged image data by performing high dynamic range (HDR) processing on the plurality of pieces of image data.

The camera controller 1216 may provide a control signal to each of the plurality of cameras 1100*a*, 1100*b*, and 1100*c*. The control signal generated by the camera controller 1216 may be provided to corresponding cameras 1100*a*, 1100*b*, and 1100*c* through control signal lines CSLa, CSLb, and CSLc separated from each other.

Any one, e.g., the camera 1100*b*, of the plurality of cameras 1100*a*, 1100*b*, and 1100*c* may be designated as a master camera according to the image generating information including the zoom signal or to the mode signal, and the other cameras, e.g., the cameras 1100*a* and 1100*c*, may be designated as slave cameras. This information may be included in the control signal and provided to corresponding cameras 1100*a*, 1100*b*, and 1100*c* through the control signal lines CSLa, CSLb, and CSLc separated from each other.

Cameras operating as a master and slaves may be changed according to the zoom factor or the mode signal. In an implementation, if the field of view of the camera 1100*a* is wider than the field of view of the camera 1100*b*, and the zoom factor indicates a low zoom magnification, the camera 1100*b* may operate as a master, and the camera 1100*a* may operate as a slave. Otherwise, if the zoom factor indicates a high zoom magnification, the camera 1100*a* may operate as a master, and the camera 1100*b* may operate as a slave.

In some embodiments, the control signal provided from the camera controller 1216 to each of the plurality of cameras 1100*a*, 1100*b*, and 1100*c* may include a sync enable signal. In an implementation, if the camera 1100*b* is a master camera, and the cameras 1100*a* and 1100*c* are slave cameras, the camera controller 1216 may send the sync enable signal to the camera 1100*b*. The camera 1100*b* having received the sync enable signal may generate a sync signal based on the received sync enable signal and provide the generated sync signal to the cameras 1100*a* and 1100*c* through a sync signal line SSL. The camera 1100*b* and the cameras 1100*a* and 1100*c* may be synchronized with the sync signal and transmit image data to the application processor 1200.

In some embodiments, the control signal provided from the camera controller 1216 to the plurality of cameras 1100*a*, 1100*b*, and 1100*c* may include mode information according to the mode signal. Based on the mode information, the plurality of cameras 1100*a*, 1100*b*, and 1100*c* may operate in a first operation mode or a second operation mode regarding a sensing rate.

In the first operation mode, the plurality of cameras 1100*a*, 1100*b*, and 1100*c* may generate an image signal at a first speed (e.g., generate the image signal at a first frame rate), encode the image signal at a second speed higher than the first speed (e.g., encode the image signal at a second frame rate higher than the first frame rate), and send the encoded image signal to the application processor 1200. Herein, the second speed may be 30 times or less the first speed.

The application processor 1200 may store the received image signal, i.e., the encoded image signal, in the internal memory 1230 or an external memory 1400 outside the application processor 1200, then read the encoded image signal from the internal memory 1230 or the external memory 1400, decode the encoded image signal, and display image data generated based on the decoded image signal. In an implementation, a corresponding sub-image processor among the plurality of sub-image processors 1212*a*, 1212*b*, and 1212*c* of the image processing device 1210 may perform decoding and perform image processing on a decoded image signal.

In the second operation mode, the plurality of cameras 1100*a*, 1100*b*, and 1100*c* may generate an image signal at a third speed lower than the first speed (e.g., generate the image signal at a third frame rate lower than the first frame rate) and send the image signal to the application processor 1200. The image signal provided to the application processor 1200 may be a non-encoded signal. The application processor 1200 may perform image processing on the received image signal or store the received image signal in the internal memory 1230 or the external memory 1400.

The PMIC 1300 may supply power, e.g., a power source voltage, to each of the plurality of cameras 1100*a*, 1100*b*, and 1100*c*. In an implementation, under control by the application processor 1200, the PMIC 1300 may supply first power to the camera 1100*a* through a power signal line PSLa, supply second power to the camera 1100*b* through a power signal line PSLb, and supply third power to the camera 1100*c* through a power signal line PSLc.

In response to a power control signal PCON from the application processor 1200, the PMIC 1300 may generate power corresponding to each of the plurality of cameras 1100*a*, 1100*b*, and 1100*c* and adjust a level of the power. The power control signal PCON may include a power adjustment signal for each operation mode of the plurality of cameras 1100*a*, 1100*b*, and 1100*c*. In an implementation, the operation mode may include a low power mode, and in the low power mode, the power control signal PCON may include information about a camera operating in the low power mode and a set power level. Levels of power respectively provided to the plurality of cameras 1100*a*, 1100*b*, and 1100*c* may be the same as or different from each other. In addition, the levels of power may be dynamically changed.

Next, a method of manufacturing an image sensor, according to embodiments, is described. FIGS. 8A to 8G are cross-sectional views of a method of manufacturing an image sensor, according to example embodiments, wherein each of FIGS. 8A to 8G is a cross-sectional view of a part corresponding a cross-section taken along line of FIG. 3A. A method of manufacturing the image sensor 100 described with reference to FIGS. 3A to 3D is described with reference to FIGS. 8A to 8G.

Figure 8A:
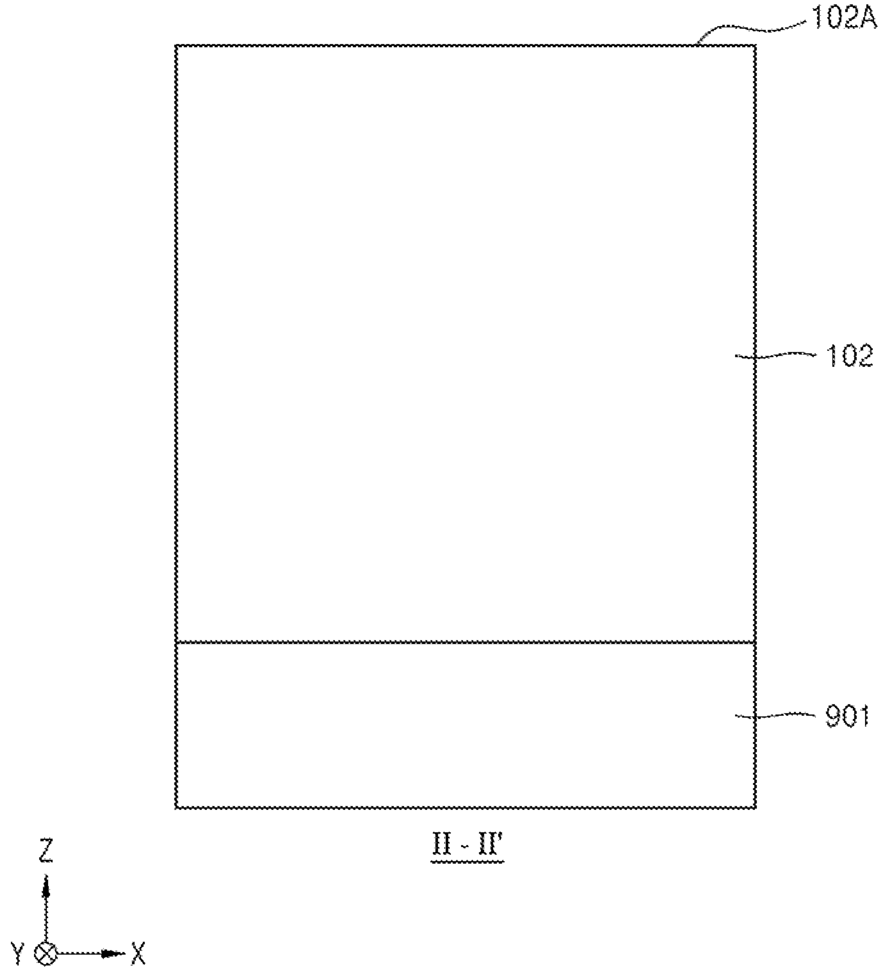
FIGS. 8A to 8G are cross-sectional views of a method of manufacturing an image sensor, according to example embodiments, wherein each of FIGS. 8A to 8G is a cross-sectional view of a part corresponding to a cross-section taken along line II-II' of FIG. 3A.

Referring to FIG. 8A, the substrate 102 including an epitaxial semiconductor layer may be on a silicon substrate 901. In embodiments, the silicon substrate 901 may include monocrystalline silicon. The substrate 102 may include a monocrystalline silicon layer epitaxially grown from the surface of the silicon substrate 901. In embodiments, the silicon substrate 901 and the substrate 102 may include a monocrystalline silicon layer doped with B ions. After forming the substrate 102, the front-side surface 102A of the substrate 102 may be exposed.

Figure 8B:
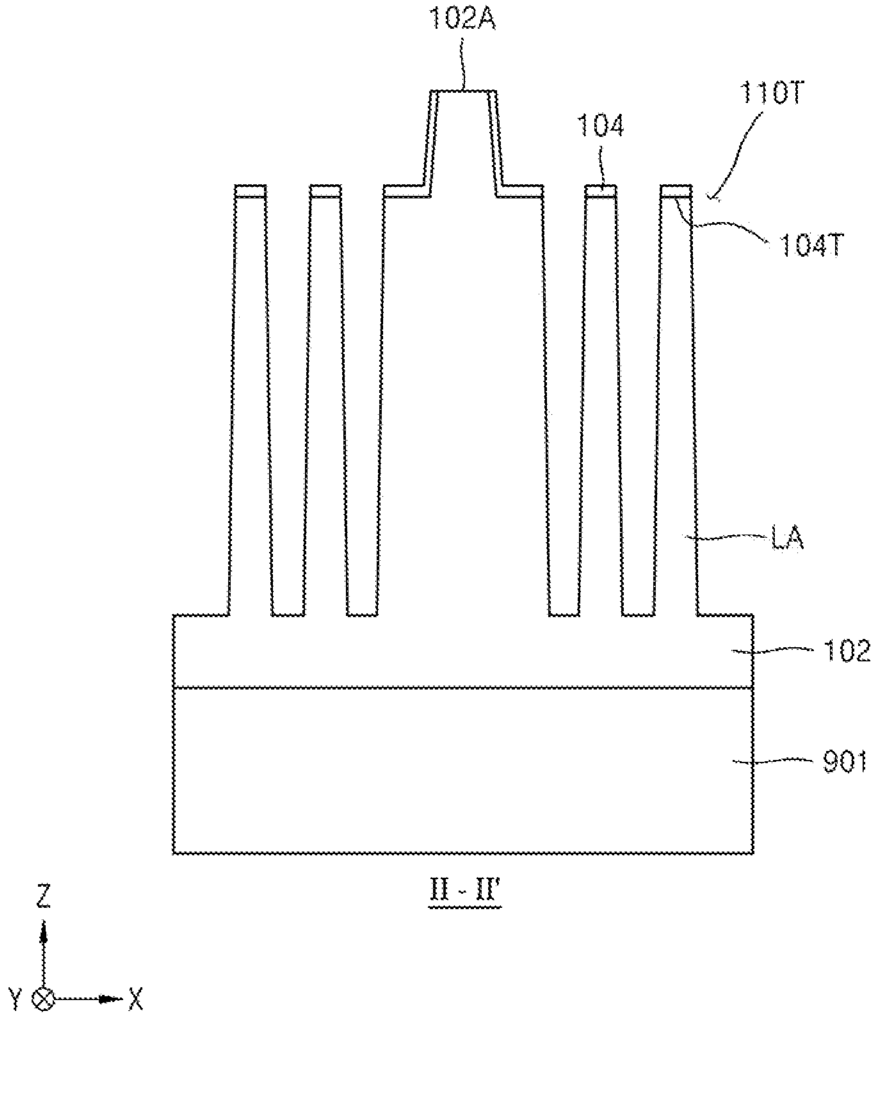

Referring to FIG. 8B, in a result of FIG. 8A, a plurality of shallow trenches 104T may be formed by etching a part of the substrate 102 from the front-side surface 102A of the substrate 102, and then the local isolation layer 104 filling the plurality of shallow trenches 104T may be formed. Thereafter, a plurality of deep trenches 110T penetrating the local isolation layer 104 and a part of the substrate 102 may be formed.

According to an embodiment, in an operation of etching a part of the substrate 102, a first etching process of forming the isolation layer connection portion 113 (see FIG. 3B) may be performed, and then a second etching process of forming the outer isolation layer 112 (see FIG. 3B) and the inner isolation layer 114 (see FIG. 3B) may be performed. In another embodiment, the first etching process and the second etching process may be performed at the same time.

Figure 8C:
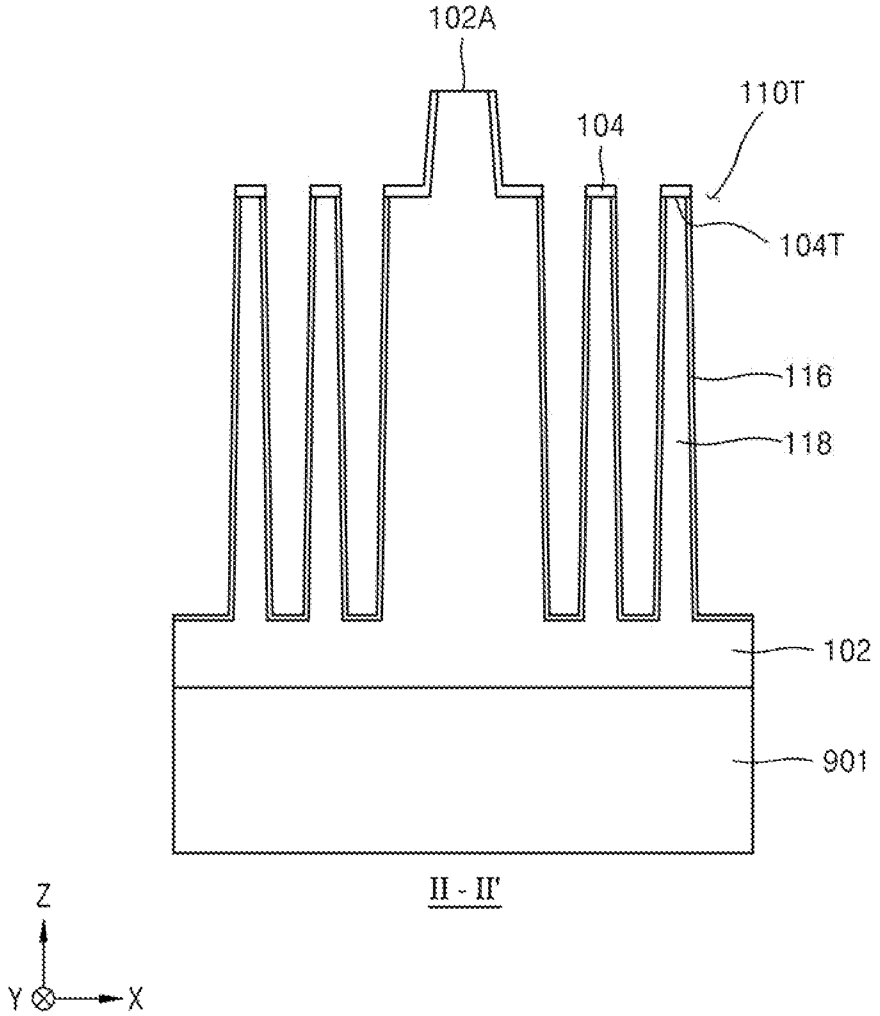

Referring to FIG. 8C, in a result of FIG. 8B, the isolation liner 116 and the isolation pillar 118 may be in a region LA (see FIG. 8B) having a relatively narrow width limited by a deep trench 110T in the substrate 102 by performing an ion injection process through the deep trench 110T and then performing heat treatment. The isolation liner 116 and the isolation pillar 118 may be formed at the same time. The isolation pillar 118 may be a result obtained by dopants, which may be ion-injected through the deep trench 110T, spreading to the region LA of the substrate 102 by the heat treatment. The isolation liner 116 may be conformally formed in the interior of the deep trench 110T, and the isolation pillar 118 may be undoped.

Figure 8D:
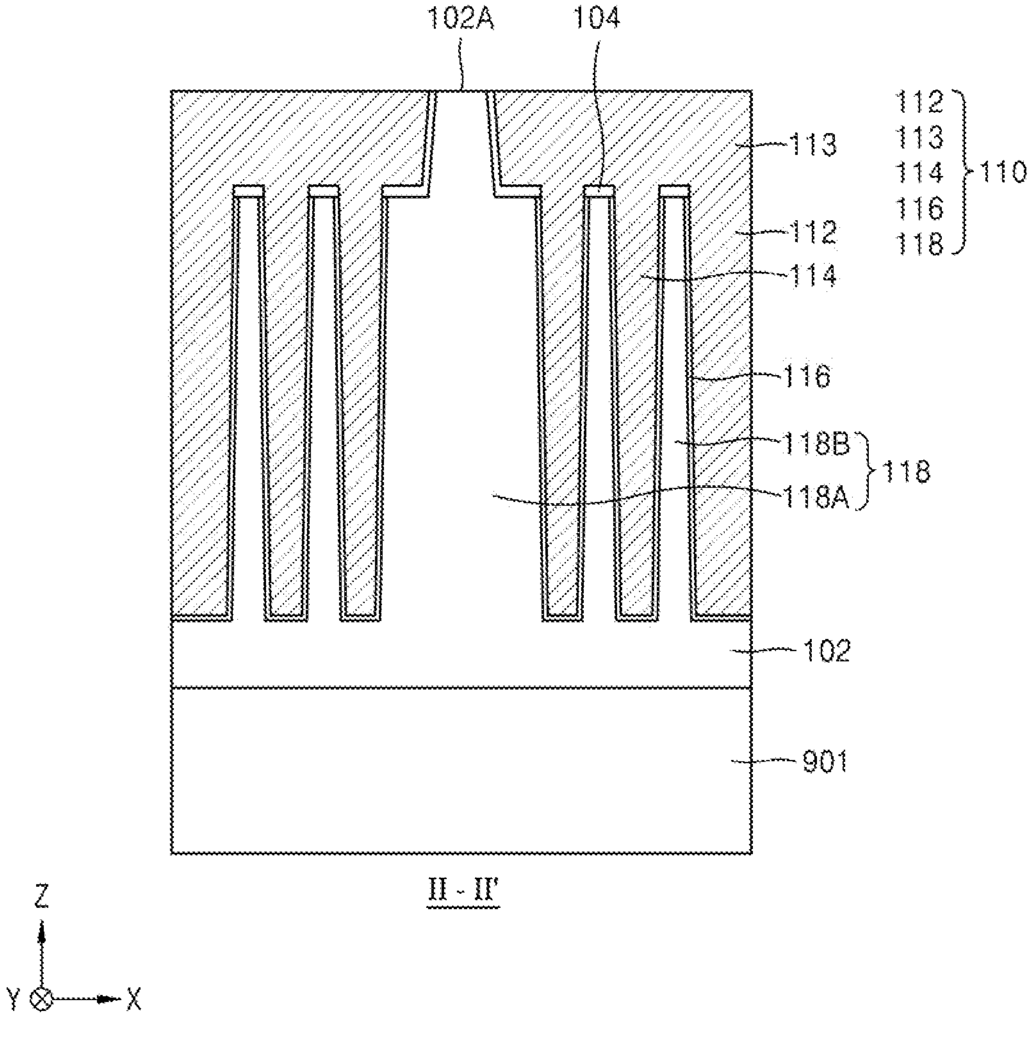

Referring to FIG. 8D, in a result of FIG. 8C, the outer isolation layer 112 and the plurality of inner isolation layers 114 filling deep trenches 110T may be formed. The outer isolation layer 112, the isolation layer connection portion 113, the plurality of inner isolation layers 114, the isolation liner 116, and the isolation pillar 118 may constitute the pixel isolation structure 110. The sensing area SA (see FIG. 3B) may be defined by the outer isolation layer 112.

Thereafter, the first to fourth photodiodes PD1, PD2, PD3, and PD4 (see FIG. 3A) may be in the sensing area SA by an ion injection process from the front-side surface 102A of the substrate 102. In embodiments, to form the first to fourth photodiodes PD1, PD2, PD3, and PD4 (see FIG. 3A), ion injection processes for forming a plurality of first semiconductor regions 132 (see FIG. 3A) and a plurality of second semiconductor regions 134 (see FIG. 3A) may be performed.

Figure 8E:
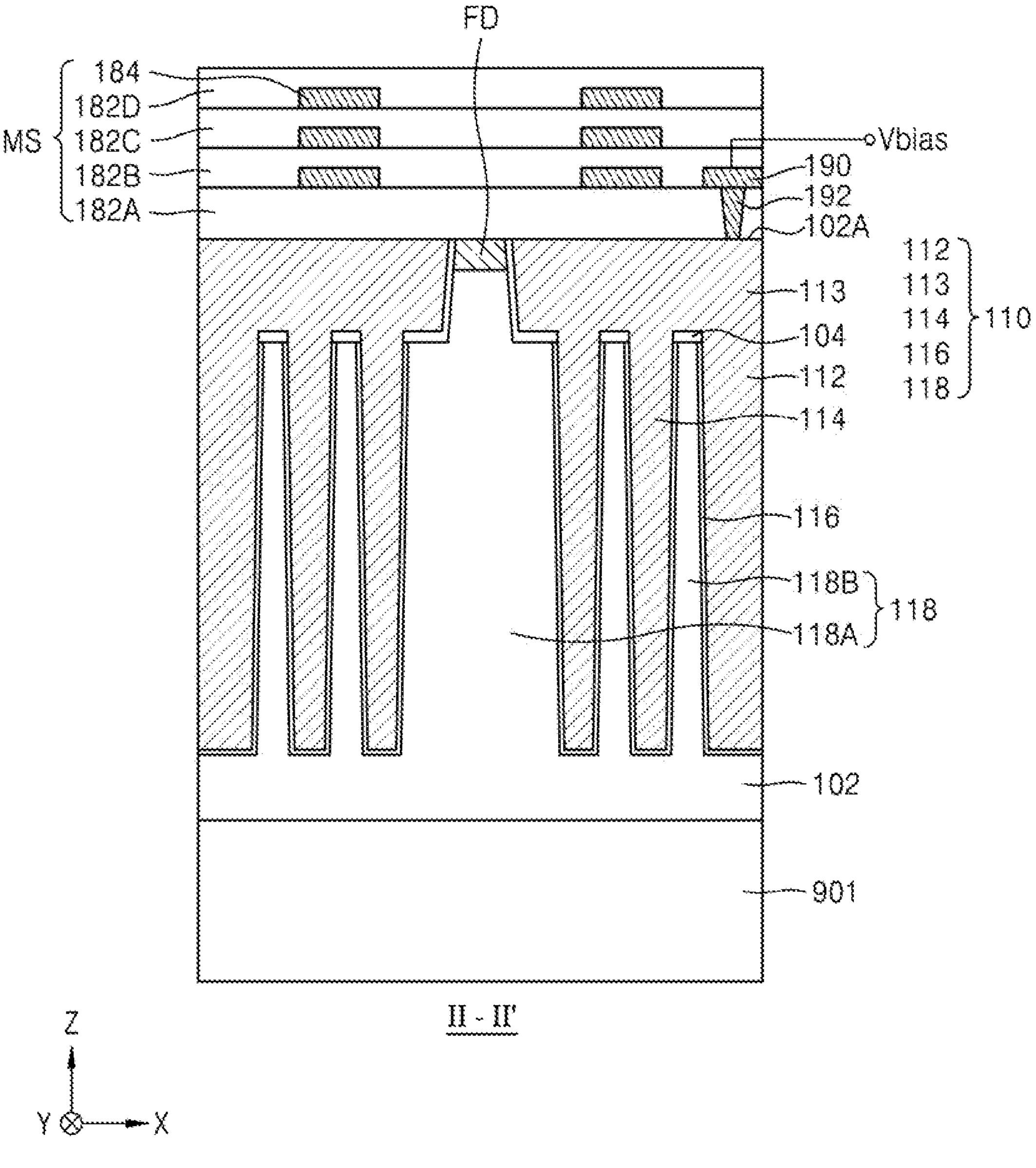

Referring to FIG. 8E, in a result of FIG. 8D, the floating diffusion region FD may be formed by injecting impurity ions to a partial region of the substrate 102 from the front-side surface 102A of the substrate 102. A plurality of gate structures including the gate dielectric layer 142 (see FIG. 3B) and the transfer gate 144 (see FIG. 3B) may be on the front-side surface 102A of the substrate 102.

The plurality of gate structures may include gate structures constituting transistors required to drive the four subpixels SP1 included in the image sensor 100 described with reference to FIGS. 2 to 3D. Thereafter, the wiring structure MS including the first to fourth interlayer insulating layers 182A, 182B, 182C, and 182D and the plurality of wiring layers 184 of a multi-layer structure may be on the plurality of gate structures.

In addition, the wiring structure MS may include the voltage application wiring layer 190 and the plurality of contacts 192 constructed to apply the bias voltage Vbias (see FIG. 3C) to the pixel isolation structure 110. In another embodiment, the voltage application wiring layer 190 and the plurality of contacts 192 constructed to apply the bias voltage Vbias (see FIG. 3C) to the pixel isolation structure 110 may be beneath the pixel isolation structure 110. In this case, the contact 192 may be a back contact (BC). Although the present embodiment illustrates only a partial region of the color pixel CP1 of the substrate 102, the substrate 102 may further include the plurality of pixel groups PG described with reference to FIG. 1, and a peripheral circuit area and a pad area around the plurality of pixel groups PG. The peripheral circuit area may include various types of circuits configured to control the plurality of pixel groups PG. In an implementation, the peripheral circuit area may include a plurality of transistors. The plurality of transistors may be driven to provide a certain signal to each of the first to fourth photodiodes PD1, PD2, PD3, and PD4 or control an output signal of each of the first to fourth photodiodes PD1, PD2, PD3, and PD4. In an implementation, the plurality of transistors may constitute various types of logic circuits, such as a timing generator, a row decoder, a row driver, a CDS, an ADC, a latch, and a column decoder. The pad area may include conductive pads electrically connected to the plurality of pixel groups PG and circuits in the peripheral circuit area. The conductive pads may function as connection terminals through which power and signals may be provided from the outside to the plurality of pixel groups PG and the circuits in the peripheral circuit area.

Figure 8F:
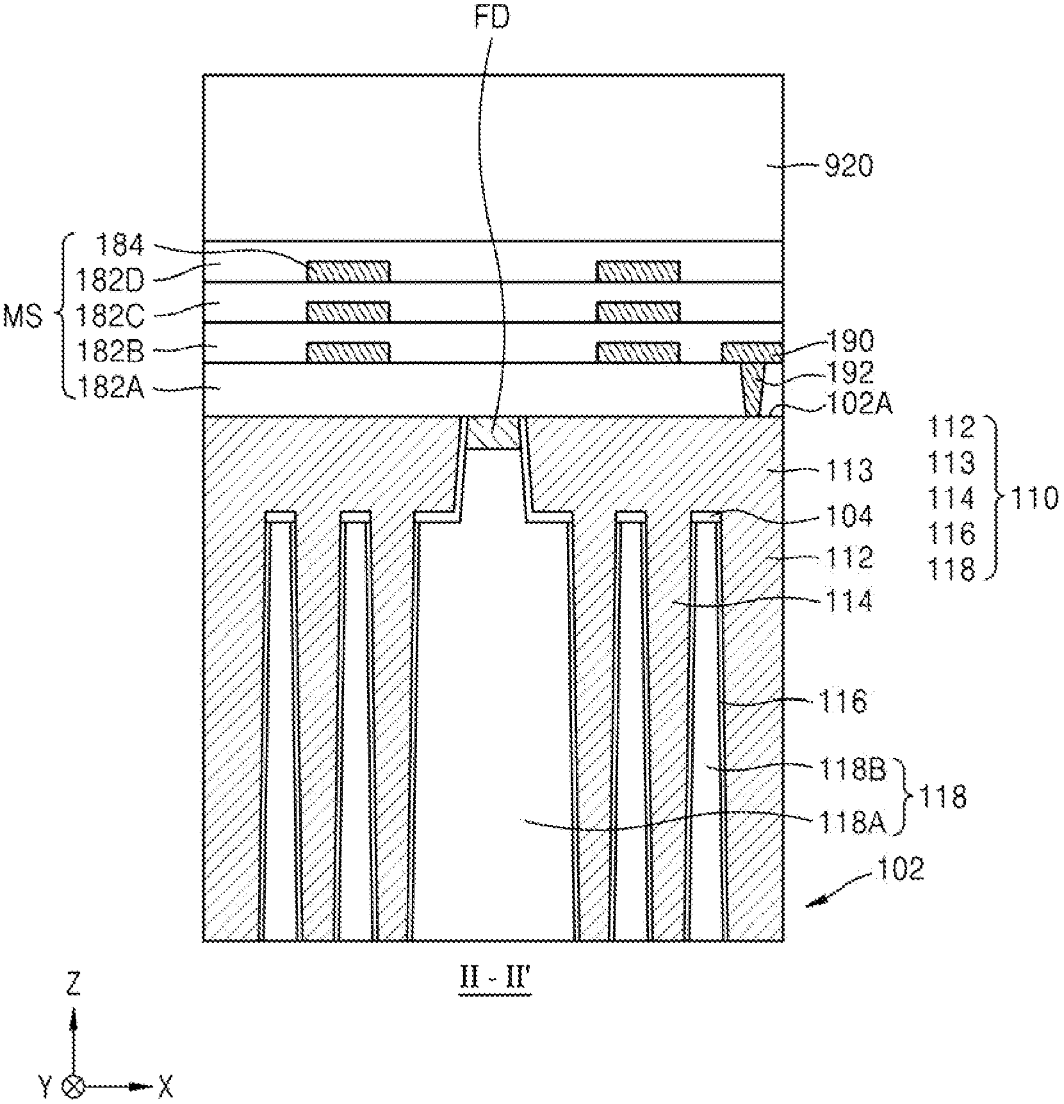

Referring to FIG. 8F, in a result of FIG. 8E, a support substrate 920 may adhere onto the wiring structure MS. An adhesion layer may be between the support substrate 920 and the fourth interlayer insulating layer 182D. Thereafter, in a state in which the support substrate 920 adheres onto the wiring structure MS, a mechanical grinding process, a chemical mechanical polishing (CMP) process, or a wet etching process, may be used to remove the silicon substrate 901 (see FIG. 8E), a part of the substrate 102, and a part of the isolation liner 116, thereby exposing the backside surface 102B of the substrate 102, a lower surface of the outer isolation layer 112, the lower surfaces of the plurality of inner isolation layers 114, a lower surface of the isolation liner 116, and a lower surface of the isolation pillar 118.

Figure 8G:
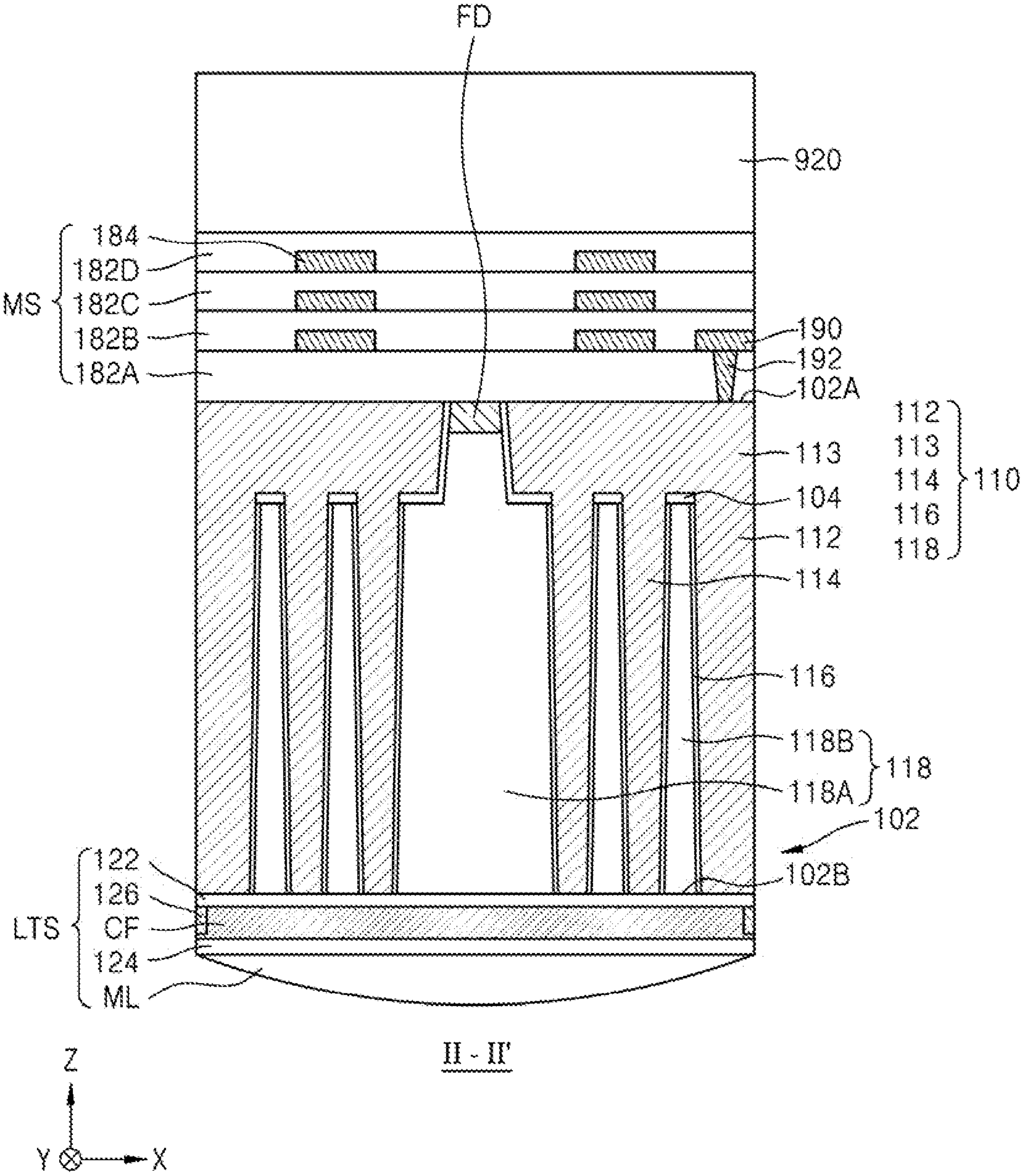

Referring to FIG. 8G, in a result of FIG. 8F, the light-transmissive structure LTS may be formed by sequentially forming the first planarization layer 122, the partition 126, the color filter CF, the second planarization layer 124, and the microlens ML on the backside surface 102B of the substrate 102, the lower surface of the outer isolation layer 112, the lower surfaces of the plurality of inner isolation layers 114, the lower surface of the isolation liner 116, and the lower surface of the isolation pillar 118. Thereafter, the support substrate 920 may be removed to manufacture the image sensor 100 shown in FIGS. 3A to 3D.

According to the method of manufacturing the image sensor 100, according to the embodiments described with reference to FIGS. 8A to 8G, the image sensor 100 may include the second isolation pillar 118B separating at least parts of two of the plurality of inner isolation layers 114 in the horizontal direction (the X direction and/or the Y direction), thereby reducing a blooming effect that charges of a pixel exceed a saturation level.

In particular, in the process described with reference to FIG. 8B, by performing the first etching process of forming the isolation layer connection portion 113 and then performing the second etching process of forming the outer isolation layer 112 and the inner isolation layer 114, the outer isolation layer 112, the isolation layer connection portion 113, and the inner isolation layer 114 may be integrally formed.

The image sensor 100 may include the second isolation pillar 118B separating at least parts of two of the plurality of inner isolation layers 114 in the horizontal direction (the X direction and/or the Y direction), thereby reducing a blooming effect that charges of a pixel exceed a saturation level. Therefore, the reliability and electrical stability of the image sensor 100 may be improved.

By way of summation and review, an image sensor including a plurality of photodiodes, and an electronic system including the same. An image sensor generates an image of a subject by using a photoelectric conversion element that reacts to the intensity of light reflected from the subject. Recently, complementary metal oxide semiconductor (CMOS)-based image sensors capable of implementing high resolution have been widely used. An image sensor capable of obtaining a high-quality image even when the size of a pixel is reduced, and an electronic system including the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present invention as set forth in the following claims.

What is claimed is:

1. An image sensor comprising:

a color pixel including a plurality of subpixels arranged in an m×n matrix, and each of m and n is a natural number of 2 to 10, on a substrate; and a pixel isolation structure configured to isolate each of the plurality of subpixels in the color pixel, wherein the pixel isolation structure includes:

an outer isolation layer surrounding the color pixel;

at least one isolation layer connection portion extending in a center direction of the color pixel from an inner wall of the outer isolation layer;

at least one inner isolation layer limiting a size of a partial region of each of the plurality of subpixels in a region limited by the outer isolation layer, including a part between two subpixels adjacent to each other among the plurality of subpixels, and extending in a vertical downward direction from the at least one isolation layer connection portion;

an isolation liner covering both sidewalls of the at least one inner isolation layer; and at least one isolation pillar in contact with at least two subpixels selected from among the plurality of subpixels and limiting the size of the partial region of each of the plurality of subpixels together with the at least one inner isolation layer.

2. The image sensor as claimed in claim 1, wherein the substrate includes a front-side surface and a backside surface, which are opposite to each other, and an upper surface of the at least one isolation layer connection portion is in contact with the front-side surface of the substrate.

3. The image sensor as claimed in claim 2, wherein the at least one inner isolation layer penetrates the substrate in a vertical direction from the at least one isolation layer connection portion to the backside surface of the substrate.

4. The image sensor as claimed in claim 1, wherein the outer isolation layer, the at least one isolation layer connection portion, and the at least one inner isolation layer are integrally connected.

5. The image sensor as claimed in claim 1, wherein a voltage applied to the outer isolation layer is applied to the at least one inner isolation layer via the at least one isolation layer connection portion.

6. The image sensor as claimed in claim 1, further comprising a floating diffusion region overlapping the at least one isolation pillar in a vertical direction.

7. The image sensor as claimed in claim 1, further comprising:

a plurality of photodiodes respectively arranged inside the plurality of subpixels;

a plurality of color filters covering the plurality of subpixels, on a backside surface of the substrate, to respectively correspond to the plurality of subpixels; and a microlens covering the plurality of subpixels with the plurality of color filters therebetween.

8. The image sensor as claimed in claim 1, further comprising a plurality of color filters covering the plurality of subpixels, on a backside surface of the substrate, to respectively correspond to the plurality of subpixels, wherein the plurality of color filters have the same color.

9. The image sensor as claimed in claim 1, wherein the color pixel includes four subpixels arranged in a 2×2 matrix, the at least one isolation pillar includes one isolation pillar in contact with each of the four subpixels, and the at least one isolation layer connection portion includes four isolation layer connection portions in contact with the one isolation pillar.

10. The image sensor as claimed in claim 1, wherein the color pixel includes four subpixels arranged in a 2×2 matrix, the at least one isolation pillar includes a plurality of isolation pillars separated from each other in a horizontal direction, each of the plurality of isolation pillars being in contact with at least two subpixels selected from among the four subpixels, the at least one inner isolation layer includes a cross-shaped inner isolation layer facing each of the four subpixels, and the cross-shaped inner isolation layer is in contact with at least some of the plurality of isolation pillars.

11. An image sensor comprising:

a pixel group on a substrate and including a plurality of color pixels each including a plurality of subpixels arranged in a 2×2 matrix; and a pixel isolation structure configured to isolate each of the plurality of subpixels in each of the plurality of color pixels, wherein each of the plurality of color pixels includes a plurality of subpixels, the plurality of subpixels in one color pixel selected from among the plurality of color pixels are arranged in an m×n matrix, and each of m and n is a natural number of 2 to 10, the plurality of subpixels in the selected one color pixel have the same color, and the pixel isolation structure includes:

an outer isolation layer surrounding the color pixel;

at least one isolation layer connection portion extending in a center direction of the color pixel from an inner wall of the outer isolation layer;

a plurality of inner isolation layers limiting a size of a partial region of each of the plurality of subpixels in a region limited by the outer isolation layer, including a part between two subpixels adjacent to each other among the plurality of subpixels, and extending in a vertical downward direction from the at least one isolation layer connection portion;

an isolation liner covering both sidewalls of the plurality of inner isolation layers; and a plurality of isolation pillars in contact with at least two subpixels selected from among the plurality of subpixels and limiting the size of the partial region of each of the plurality of subpixels together with the plurality of inner isolation layers, the plurality of inner isolation layers being separated from each other in a horizontal direction.

12. The image sensor as claimed in claim 11, wherein the plurality of isolation pillars include:

a first isolation pillar adjacent to the center of the color pixel and facing all of the plurality of subpixels; and a plurality of second isolation pillars arranged between every two of the plurality of inner isolation layers and each facing two of the plurality of subpixels.

13. The image sensor as claimed in claim 12, wherein a ratio of a height of the substrate to a height of the at least one isolation layer connection portion is 500% or less.

14. The image sensor as claimed in claim 12, wherein a range of a horizontal width of each of the plurality of inner isolation layers is about 50 nm to about 400 nm, and a range of a horizontal width of each of the plurality of second isolation pillars is about 50 nm to about 400 nm.

15. The image sensor as claimed in claim 11, wherein the color pixel includes four subpixels arranged in a 2×2 matrix, the plurality of inner isolation layers include a cross-shaped inner isolation layer facing each of the four subpixels, and the cross-shaped inner isolation layer is in contact with at least some of the plurality of isolation pillars.

16. The image sensor as claimed in claim 15, wherein the at least one isolation layer connection portion is one isolation layer connection portion, and the cross-shaped inner isolation layer and the plurality of inner isolation layers extend in the vertical downward direction from a lower surface of the isolation layer connection portion.

17. The image sensor as claimed in claim 11, wherein the plurality of color pixels include a first green color pixel, a red color pixel, a blue color pixel, and a second green color pixel, the plurality of subpixels included in one color pixel include four subpixels arranged in a 2×2 matrix, each of the isolation liner and the plurality of isolation pillars includes a silicon region doped with a P+-type impurity, and the isolation liner and the plurality of isolation pillars are integrally connected.

18. The image sensor as claimed in claim 11, further comprising:

a floating diffusion region overlapping the plurality of isolation pillars in a vertical direction;

a plurality of photodiodes respectively arranged inside the plurality of subpixels;

a plurality of color filters covering the plurality of subpixels, on a backside surface of the substrate, to respectively correspond to the plurality of subpixels; and one or more microlenses covering the plurality of subpixels with the plurality of color filters therebetween, the plurality of color filters respectively corresponding to the plurality of subpixels.

19. The image sensor as claimed in claim 11, wherein the outer isolation layer, the at least one isolation layer connection portion, and the plurality of inner isolation layers are integrally connected, and each of the outer isolation layer, the at least one isolation layer connection portion, and the plurality of inner isolation layers includes silicon oxide, silicon nitride, silicon carbon nitride, silicon oxynitride, silicon oxycarbide, silicon dioxide, polysilicon, a metal, metal nitride, metal oxide, borosilicate glass, phosphosilicate glass, borophosphosilicate glass, plasma enhanced tetraethyl orthosilicate, fluoride silicate glass, carbon doped silicon oxide, or organosilicate glass, air.

20. An electronic system comprising:

at least one camera including an image sensor; and a processor configured to process image data received from the at least one camera, wherein the image sensor includes:

a color pixel including a plurality of subpixels arranged in an m×n matrix, and each of m and n is a natural number of 2 to 10, on a substrate; and a pixel isolation structure configured to isolate each of the plurality of subpixels in the color pixel, the pixel isolation structure including:

an outer isolation layer surrounding the color pixel;

at least one isolation layer connection portion extending in a center direction of the color pixel from an inner wall of the outer isolation layer;

at least one inner isolation layer limiting a size of a partial region of each of the plurality of subpixels in a region limited by the outer isolation layer, including a part between two subpixels adjacent to each other among the plurality of subpixels, and extending in a vertical downward direction from the at least one isolation layer connection portion;

an isolation liner covering both sidewalls of the at least one inner isolation layer; and at least one isolation pillar in contact with at least two subpixels selected from among the plurality of subpixels and limiting the size of the partial region of each of the plurality of subpixels together with the at least one inner isolation layer.

* * * * *